US 12,323,129 B2

(12) United States Patent
Ogawa

(10) Patent No.: US 12,323,129 B2
(45) Date of Patent: Jun. 3, 2025

(54) RESONATOR AND FILTER

(71) Applicant: Soshin Electric Co., Ltd., Saku (JP)

(72) Inventor: Keisuke Ogawa, Otsu (JP)

(73) Assignee: Soshin Electric Co., Ltd., Saku (JP)

( * ) Notice: Subject to any disclaimer, the term of this patent is extended or adjusted under 35 U.S.C. 154(b) by 974 days.

(21) Appl. No.: 17/310,452

(22) PCT Filed: Feb. 3, 2020

(86) PCT No.: PCT/JP2020/003844
§ 371 (c)(1),
(2) Date: Aug. 4, 2021

(87) PCT Pub. No.: WO2020/162379
PCT Pub. Date: Aug. 13, 2020

(65) Prior Publication Data
US 2022/0131522 A1    Apr. 28, 2022

(30) Foreign Application Priority Data

Feb. 8, 2019    (JP) ................... 2019-021344

(51) Int. Cl.
  *H03H 9/17*    (2006.01)
  *H03H 9/13*    (2006.01)
  *H03H 9/56*    (2006.01)
(52) U.S. Cl.
  CPC ............. *H03H 9/17* (2013.01); *H03H 9/13* (2013.01); *H03H 9/56* (2013.01)
(58) Field of Classification Search
  CPC ........ H01P 7/082; H01P 7/08; H01P 1/20345; H01P 1/203; H01P 1/20; H01P 3/08;
  (Continued)

(56) References Cited

U.S. PATENT DOCUMENTS 5,105,175 A * 4/1992 Kaltenecker .......... H01P 11/008
  333/219
5,621,366 A * 4/1997 Gu ......................... H01P 7/084
  333/204

(Continued)

FOREIGN PATENT DOCUMENTS

JP    2002-151908 A    5/2002
JP    3501327 B2       3/2004
(Continued)

OTHER PUBLICATIONS

International Search Report and Written Opinion (Application No. PCT/JP2020/003844) dated Apr. 14, 2020.

*Primary Examiner* — John W Poos
(74) *Attorney, Agent, or Firm* — BURR PATENT LAW, PLLC

(57) ABSTRACT

Provided are a resonator and a filter that exhibit preferable characteristics. This resonator has: a via electrode which is formed within a dielectric substrate; a plurality of shielded conductors which are formed in the dielectric substrate so as to surround the via electrode; and a strip line which is connected to the via electrode inside the dielectric substrate and which is disposed so as to at least face the shielded conductors, wherein, of the plurality of shielded conductors, one that is connected to a short-circuited end of the via electrode is capacitatively coupled, across a spacing, to a first input/output terminal and a second input/output terminal.

10 Claims, 19 Drawing Sheets

(58) Field of Classification Search
CPC .... H01P 7/084; H01P 1/20381; H01P 1/2002;
H01P 1/20327; H01P 1/2084; H01P
1/2088; H01P 1/213; H01P 3/16; H01P
1/20336; H01P 7/04; H01P 1/20309;
H01P 1/205; H01P 1/209; H01P 7/10;
H03H 9/6483; H03H 7/0115; H03H
2001/0085; H03H 9/02913; H03H
9/6473; H03H 9/6466; H03H 9/6463;
H03H 9/6459; H03H 9/6476; H03H
9/6469; H03H 9/6433; H03H 9/02574;
H03H 9/6479; H03H 9/642; H03H
9/6416; H03H 9/584; H03H 9/6443;
H03H 9/17; H03H 9/13; H03H 9/56
See application file for complete search history.

(56) References Cited

U.S. PATENT DOCUMENTS

| | | | |
|---|---|---|---|
| 5,945,892 | A | 8/1999 | Kato et al. |
| 9,105,956 | B2 * | 8/2015 | Huang ................. H01P 1/2138 |
| 2002/0057143 | A1 | 5/2002 | Sasaki et al. |
| 2010/0007445 | A1 | 1/2010 | Ishizaki et al. |
| 2010/0265015 | A1 | 10/2010 | Hoeft et al. |
| 2020/0176851 | A1 | 6/2020 | Motoyama |

FOREIGN PATENT DOCUMENTS

| | | | | |
|---|---|---|---|---|
| JP | 2011-507312 | A | 3/2011 | |
| JP | 4985999 | B2 | 7/2012 | |
| JP | 2017-195565 | A | 10/2017 | |
| WO | 2008/029662 | A1 | 3/2008 | |
| WO | WO-2018216239 | A1 * | 11/2018 | .......... H01P 1/20309 |

* cited by examiner

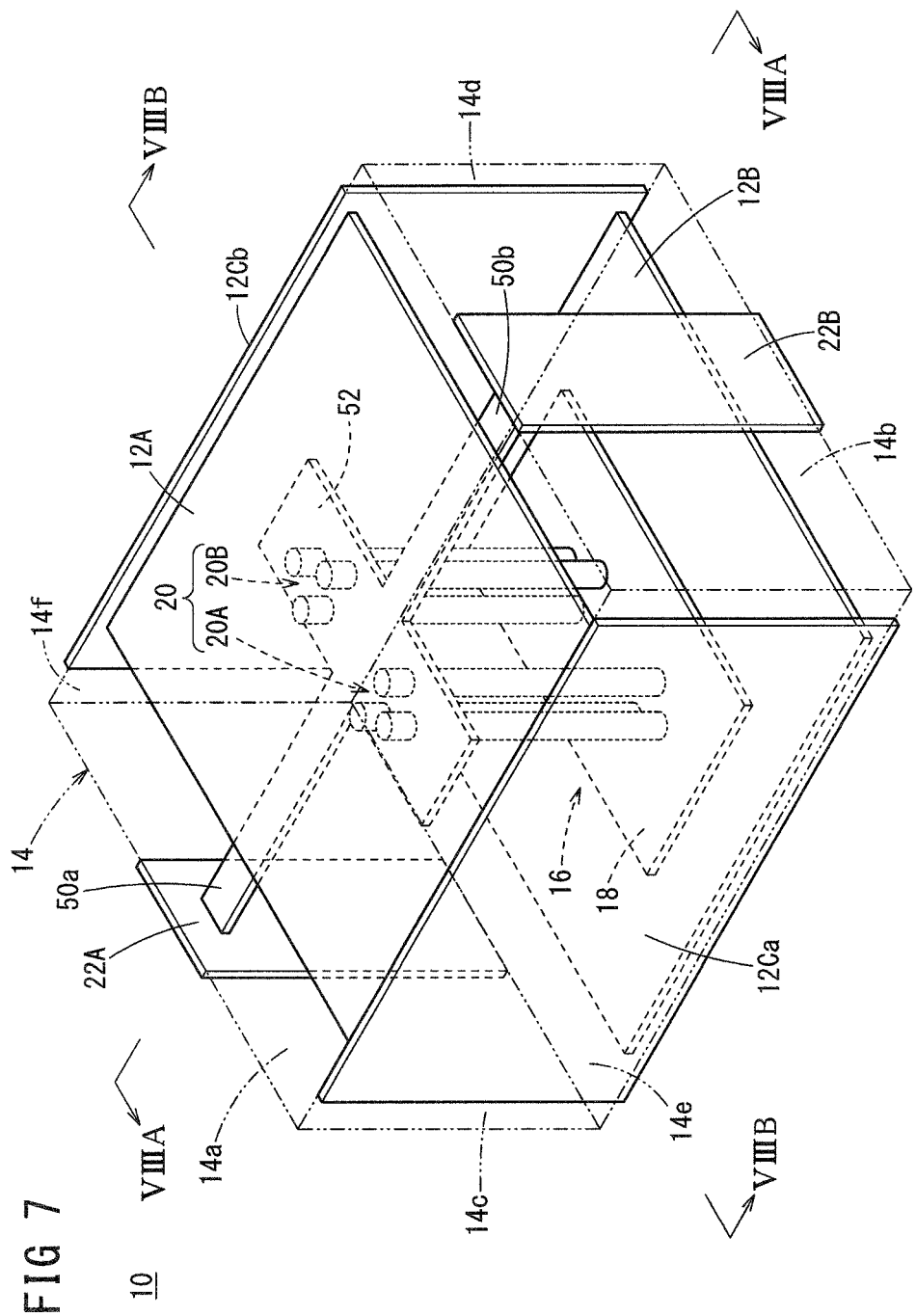

RESONATOR AND FILTER

TECHNICAL FIELD

The present invention relates to a resonator and a filter.

BACKGROUND ART

A resonator having a strip line and a via electrode has been proposed (JP 2017-195565 A, JP 3501327 B2, and JP 2011-507312 A). In such a resonator, the strip line faces a shielding conductor formed on one principal surface side of a dielectric substrate. One end of the via electrode is connected to a shielding conductor formed on the other principal surface side of the dielectric substrate. The other end of the via electrode is connected to the strip line.

SUMMARY OF INVENTION

However, in the resonators described in JP 2017-195565 A, JP 3501327 B2, and JP 2011-507312 A, it is considered that sufficiently good characteristics are not necessarily obtained.

An object of the present invention is to provide a resonator and a filter having good characteristics.

A resonator according to an aspect of the present invention includes: a via electrode portion formed inside a dielectric substrate; a plurality of shielding conductors formed on the dielectric substrate so as to surround the via electrode portion; and a strip line connected to the via electrode portion inside the dielectric substrate and that faces at least the shielding conductor, wherein a first input/output terminal and a second input/output terminal are capacitively coupled via gaps to a shielding conductor, among the plurality of shielding conductors, to which a short-circuited end of the via electrode portion is connected.

A resonator according to another aspect of the present invention includes: a via electrode portion formed inside a dielectric substrate; a plurality of shielding conductors formed on the dielectric substrate so as to surround the via electrode portion; and a strip line connected to the via electrode portion inside the dielectric substrate and that faces at least the shielding conductor, wherein a first input/output terminal or a second input/output terminal is coupled to the via electrode portion.

A filter according to still another aspect of the present invention includes the resonator described above.

According to the present invention, it is possible to provide a resonator and a filter having good characteristics.

BRIEF DESCRIPTION OF DRAWINGS

FIG. 7 is a perspective view showing a resonator according to a third modification of the first embodiment;

DESCRIPTION OF EMBODIMENTS

Preferred embodiments of a resonator and a filter according to the present invention will be described in detail below with reference to the accompanying drawings.

First Embodiment

Figure 1:
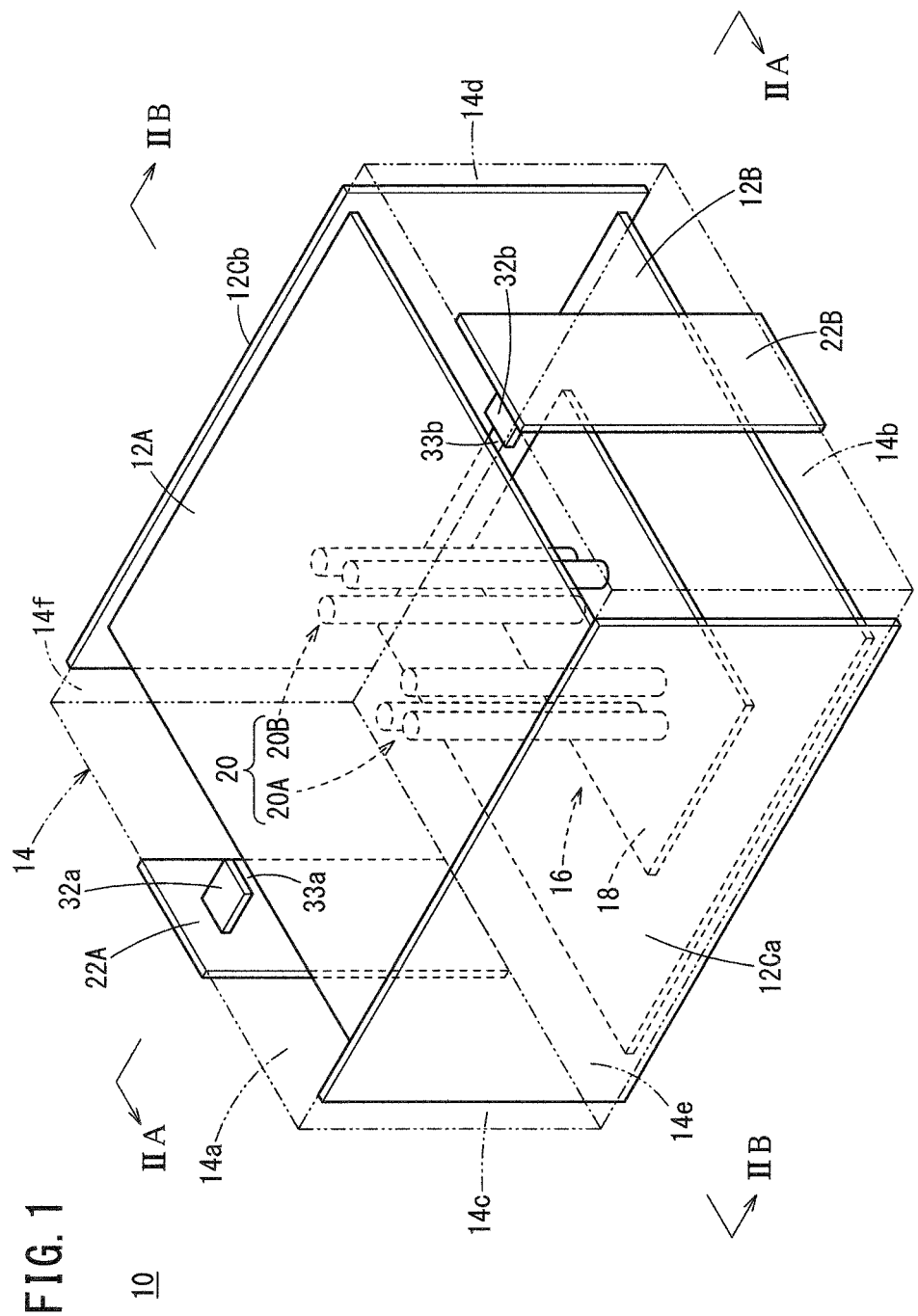
FIG. 1 is a perspective view showing a resonator according to a first embodiment.
Figure 2A:
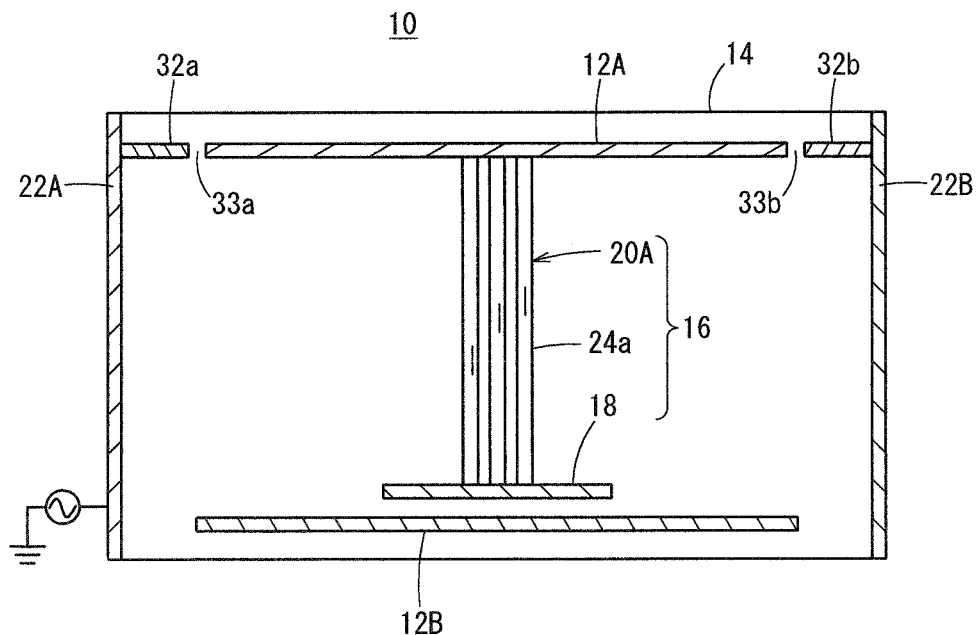
FIGS. 2A and 2B are cross-sectional views showing the resonator according to the first embodiment.
Figure 2B:
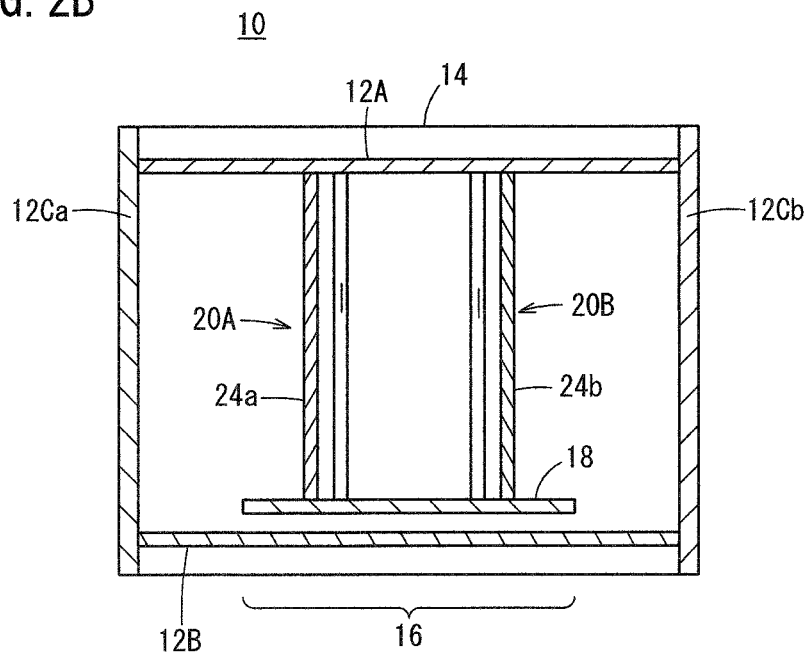

The resonator according to the first embodiment will be described with reference to the drawings. FIG. 1 is a perspective view showing a resonator according to the present embodiment. FIGS. 2A and 2B are cross-sectional views showing the resonator according to the present embodiment. FIG. 2A corresponds to a cross section taken along line IIA-IIA in FIG. 1. FIG. 2B corresponds to a cross section taken along line IIB-IIB in FIG. 1.

As shown in FIG. 1, the resonator 10 according to the present embodiment includes a dielectric substrate 14. An upper shielding conductor 12A is formed on one principal surface (upper surface) 14f side of the dielectric substrate 14. On the other principal surface (lower surface) 14e side of the dielectric substrate 14, a lower shielding conductor 12B is formed. The resonator 10 further includes a structure 16 formed inside the dielectric substrate 14. The structure 16 includes a strip line 18 formed inside the dielectric substrate 14 so as to face the lower shielding conductor 12B, and a via electrode portion 20 formed inside the dielectric substrate 14 and connected to the strip line 18. The via electrode portion 20 is formed from the strip line 18 to the upper shielding conductor 12A. The strip line 18 has, for example, a rectangular planar shape.

The dielectric substrate 14 is formed by laminating a plurality of dielectric layers and has, for example, a rectangular parallelepiped shape as shown in FIG. 1. Of the four side surfaces 14a to 14d of the dielectric substrate 14, a first input/output terminal 22A is formed on a side surface 14a, and a second input/output terminal 22B is formed on a side surface 14b facing the side surface 14a. In addition, a first side surface shielding conductor 12Ca is formed on a side surface (first side surface) 14c, and a second side surface shielding conductor 12Cb is formed on a side surface (second side surface) 14d facing the side surface 14c.

The via electrode portion 20 includes a first via electrode portion (via electrode portion) 20A and a second via electrode portion (via electrode portion) 20B. The first via electrode portion 20A and the second via electrode portion 20B are embedded in via holes formed in the dielectric substrate 14.

The first via electrode portion 20A includes a plurality of first via electrodes 24a, and the second via electrode portion 20B includes a plurality of second via electrodes 24b (see FIGS. 2A and 2B). There are no other via electrode portions between the first via electrode portion 20A and the second via electrode portion 20B.

Figure 3A:
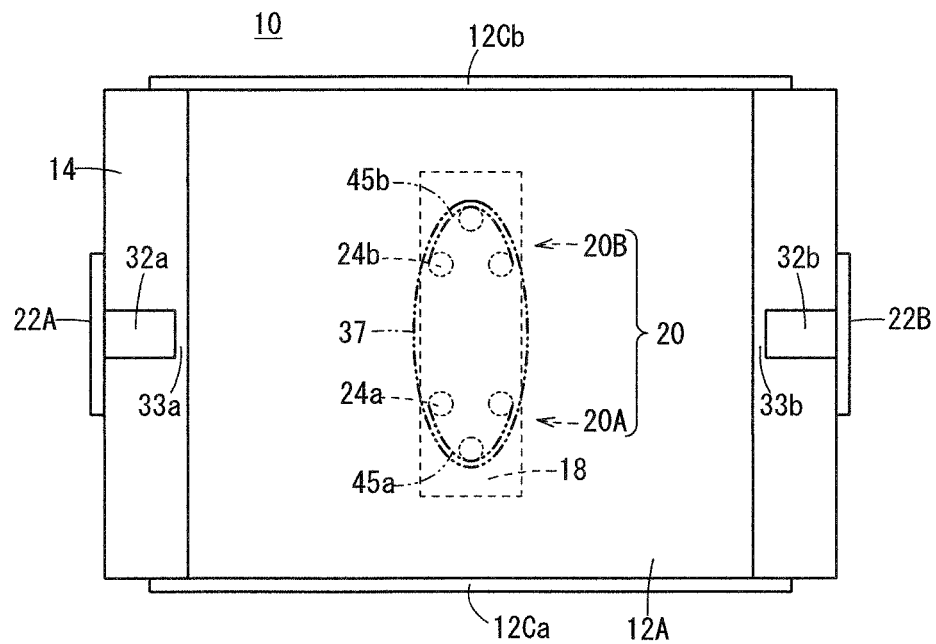
FIGS. 3A and 3B are plan views showing an example of the arrangement of via electrodes.
Figure 3B:
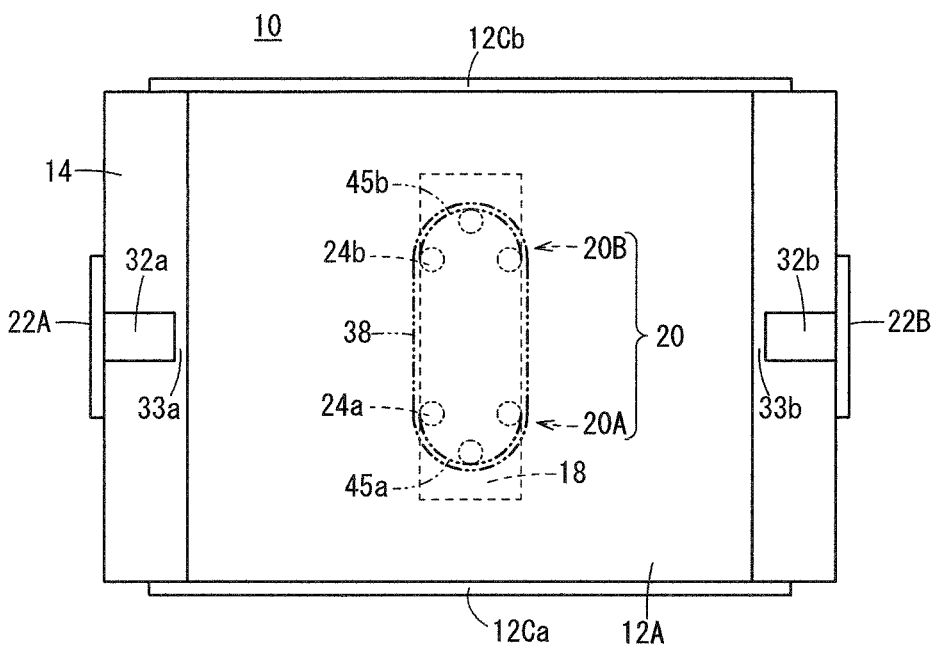

FIGS. 3A and 3B are plan views showing the resonator according to the present embodiment. FIG. 3A shows an example in which the first via electrodes 24a and the second via electrodes 24b are arranged along parts of a virtual ellipse 37. FIG. 3B shows an example in which the first via electrodes 24a and the second via electrodes 24b are arranged along parts of a virtual track shape 38.

In the example shown in FIG. 3A, the plurality of first via electrodes 24a are arranged along a virtual first curved line 45a constituting a part of the contour line of the virtual ellipse 37 when viewed from the upper surface. In the example shown in FIG. 3A, the plurality of second via electrodes 24b are arranged along a virtual second curved line 45b constituting a part of the contour line of the virtual ellipse 37 when viewed from the upper surface. In the example shown in FIG. 3B, the plurality of first via electrodes 24a are arranged along a virtual first curved line 45a constituting a part of the contour line of the virtual track shape 38 when viewed from the upper surface. In the example shown in FIG. 3B, the plurality of second via electrodes 24b are arranged along a virtual second curved line 45b constituting a part of the contour line of the virtual track shape 38 when viewed from the upper surface. FIGS. 3A and 3B show an example in which the first via electrode portion 20A is made up of three first via electrodes 24a and the second via electrode portion 20B is made up of three second via electrodes 24b, but the present invention is not limited thereto. The first via electrode portion 20A may be made up of, for example, five first via electrodes 24a, and the second via electrode portion 20B may be made up of, for example, five second via electrodes 24b. In addition, the first via electrode portion 20A may be formed of, for example, seven first via electrodes 24a, and the second via electrode portion 20B may be formed of, for example, seven second via electrodes 24b.

In the present embodiment, the first via electrodes 24a and the second via electrodes 24b are arranged along the virtual ellipse 37 or the virtual track shape 38 for the following reason. That is, in the case where the resonators 10 are arranged in multiple stages to form a filter, if the diameter of the via electrode portion 20 is simply increased, an electrical wall is generated between the resonators 10, which causes deterioration of the Q value. On the other hand, when the via electrode portion 20 is formed in an elliptical shape and the resonators 10 are arranged in multiple stages in the minor axis direction of the elliptical shape, the distance between the via electrode portions 20 becomes longer, and thus the Q value can be improved. In addition, when the via electrode portion 20 is formed in the track shape 38 and the resonators 10 are arranged in multiple stages in a direction perpendicular to the longitudinal direction of the linear portions of the track shape 38, the distance between the via electrode portions 20 becomes longer, and thus the Q value can be improved. For this reason, in the present embodiment, the first via electrodes 24a and the second via electrodes 24b are arranged along the virtual ellipse 37 or the virtual track shape 38.

In addition, in the present embodiment, the first via electrodes 24a and the second via electrodes 24b are respectively disposed at end portions of the virtual ellipse 37, i.e., both end portions having a large curvature in the virtual ellipse 37, for the following reason. In the present embodiment, the first via electrodes 24a and the second via electrodes 24b are disposed along the semicircular portions of the virtual track shape 38 for the following reason. That is, the high-frequency current concentrates on the end portions of the virtual ellipse 37, i.e., both end portions having a large curvature in the virtual ellipse 37. In addition, the high-frequency current concentrates on both end portions of the virtual track shape 38, i.e., semicircular portions of the virtual track shape 38. Therefore, even if the via electrodes 24a and 24b are not arranged in portions other than both end portions of the virtual ellipse 37 or the virtual track shape 38, the Q value of the resonator 10 is not significantly reduced. In addition, if the number of the via electrodes 24a and 24b is reduced, the time required for forming the vias can be shortened, so that the throughput can be improved. In addition, if the number of the via electrodes 24a and 24b is reduced, a material such as silver to be embedded in the vias can be reduced, so that cost reduction can also be realized. In addition, since a region in which an electromagnetic field is relatively sparse is formed between the first via electrode portion 20A and the second via electrode portion 20B, it is also possible to form a pattern for coupling adjustment or the like in the region. From such a viewpoint, in the present modification, the first via electrodes 24a and the second via electrodes 24b are disposed at both end portions of the virtual ellipse 37 or the virtual track shape 38.

The first input/output terminal 22A is coupled via a connection line 32a to the upper shielding conductor 12A to which the short-circuited end of each of the first via electrode portion 20A and the second via electrode portion 20B is connected. The second input/output terminal 22B is coupled to the upper shielding conductor 12A via a connection line 32b. The connection line 32a is not electrically connected to the upper shielding conductor 12A. The connection line 32b is not electrically connected to the upper shielding conductor 12A. The connection line 32a connected to the first input/output terminal 22A and the upper shielding conductor 12A are capacitively coupled via a first gap 33a. The connection line 32b connected to the second input/output terminal 22B and the upper shielding conductor 12A are capacitively coupled via a second gap 33b. A capacitance is formed between the connection line 32a connected to the first input/output terminal 22A and the upper shielding conductor 12A. A capacitance is formed between the connection line 32b connected to the second input/output terminal 22B and the upper shielding conductor 12A. In the present embodiment, the external Q can be adjusted by appropriately setting these capacitances.

The via electrode portion 20 of the resonator 10 operates as a resonator of the TEM wave together with the first side surface shielding conductor 12Ca and the second side surface shielding conductor 12Cb. That is, the via electrode portion 20 operates as a resonator of the TEM wave with reference to the first side surface shielding conductor 12Ca and the second side surface shielding conductor 12Cb. The strip line 18 operates as a function of forming an open-end capacitance. This is clearly different from the structure of the resonator described in JP 4985999 B2. That is, the structure of the resonator 10 is clearly different from the structure of a resonator in which a portion that operates as a resonator a TEM wave is limited to a strip line and a via electrode portion has only a function of connecting a ground conductor layer arranged in parallel to the strip line.

The via electrode portion 20 and the first side surface shielding conductor 12Ca and the second side surface shielding conductor 12Cb behave like a semi-coaxial resonator. The direction of the current flowing through the via electrode portion 20 is opposite to the direction of the current flowing through the first side surface shielding conductor 12Ca. Further, the direction of the current flowing through the via electrode portion 20 is opposite to the direction of the current flowing through the second side surface shielding conductor 12Cb. Therefore, an electromagnetic field can be confined in a portion surrounded by the shielding conductors 12A, 12B, 12Ca, and 12Cb, loss due to radiation can be reduced, and influence on the outside can be reduced. At a certain timing during resonance, a current flows so as to spread from the center of the upper shielding conductor 12A to the entire surface of the upper shielding conductor 12A. At this time, a current flows through the lower shielding conductor 12B so as to be concentrated from the entire surface of the lower shielding conductor 12B toward the center of the lower shielding conductor 12B. At another timing during resonance, a current flows so as to spread from the center of the lower shielding conductor 12B to the entire surface of the lower shielding conductor 12B. At this time, a current flows through the upper shielding conductor 12A so as to be concentrated from the entire surface of the upper shielding conductor 12A toward the center of the upper shielding conductor 12A. The current flowing so as to spread over the entire surface of the upper shielding conductor 12A or the lower shielding conductor 12B similarly flows to the first side surface shielding conductor 12Ca and the second side surface shielding conductor 12Cb as it is. That is, a current flows through a conductor having a wide line width. Since a conductor having a wide line width has a small resistance component, deterioration of the Q value can be reduced in the present embodiment.

Figure 4A:
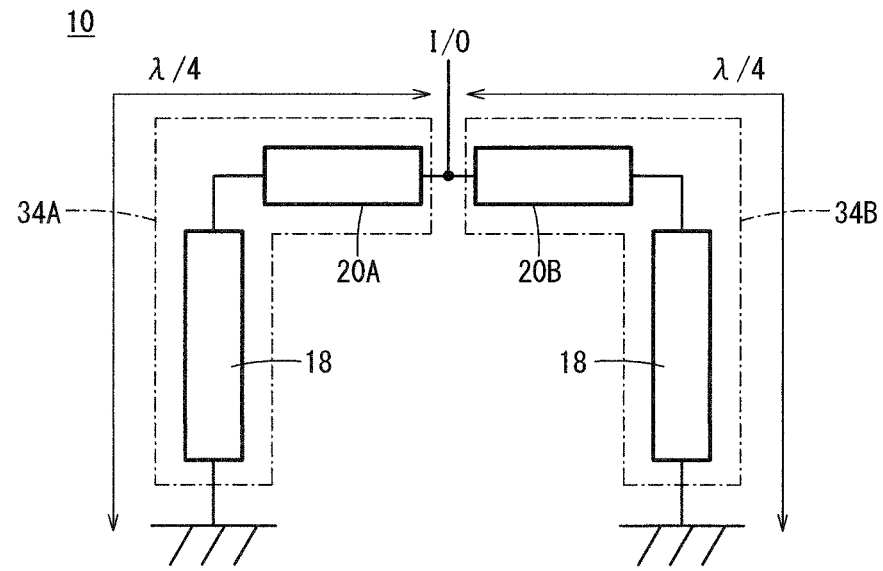
FIGS. 4A and 4B are diagrams showing equivalent circuits of the resonator according to the first embodiment.
Figure 4B:
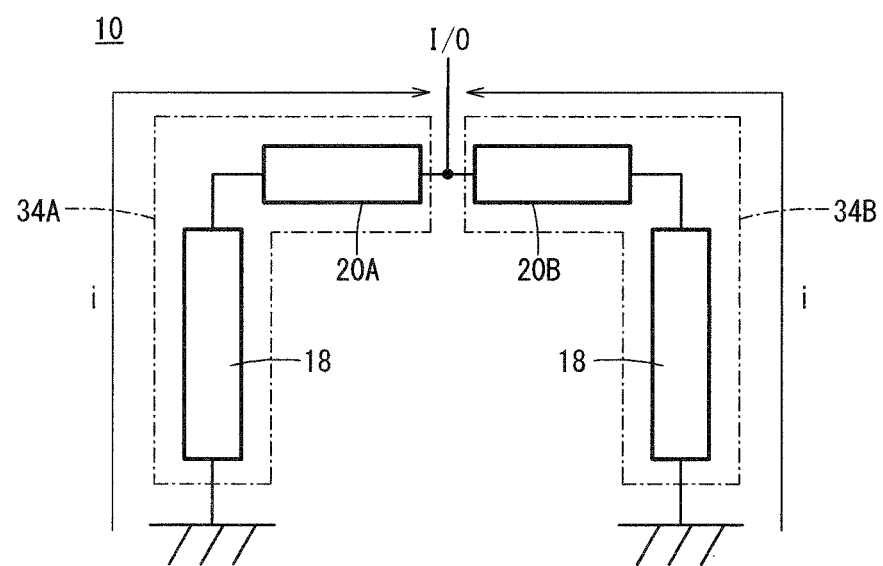

FIGS. 4A and 4B show equivalent circuits of the resonator according to the present embodiment. As shown in FIG. 4A, a first $\lambda/4$ resonator 34A is formed from the strip line 18 to the input/output portion (I/O) of the first via electrode portion 20A. A second $\lambda/4$ resonator 34B is formed from the strip line 18 to the input/output portion (I/O) of the second via electrode portion 20B. As a result, as shown in FIG. 4B, an in-phase current i flows through the first $\lambda/4$ resonator 34A and the second $\lambda/4$ resonator 34B. Since the currents flowing through the first $\lambda/4$ resonator 34A and the second $\lambda/4$ resonator 34B are in phase with each other, the electromagnetic field is sparse in the region between the first via electrode portion 20A and the second via electrode portion 20B. Therefore, in the present embodiment, the pattern can be disposed between the first via electrode portion 20A and the second via electrode portion 20B while suppressing unnecessary coupling. As a result, Q-value degradation can be prevented and variations in characteristics can be suppressed.

As described above, according to the present embodiment, the first input/output terminal 22A is coupled to the upper shielding conductor 12A via the first gap 33a, and the second input/output terminal 22B is coupled to the upper shielding conductor 12A via the second gap 33b. Since the first input/output terminal 22A is coupled to the upper shielding conductor 12A via the first gap 33a, a capacitance is formed between the first input/output terminal 22A and the upper shielding conductor 12A. In addition, since the second input/output terminal 22B is coupled to the upper shielding conductor 12A via the second gap 33b, a capacitance is formed between the second input/output terminal 22B and the upper shielding conductor 12A.

According to the present embodiment, the external Q can be adjusted by appropriately setting these capacitances. Therefore, according to the present embodiment, a resonator having good characteristics can be provided.

Modification 1

Figure 5:
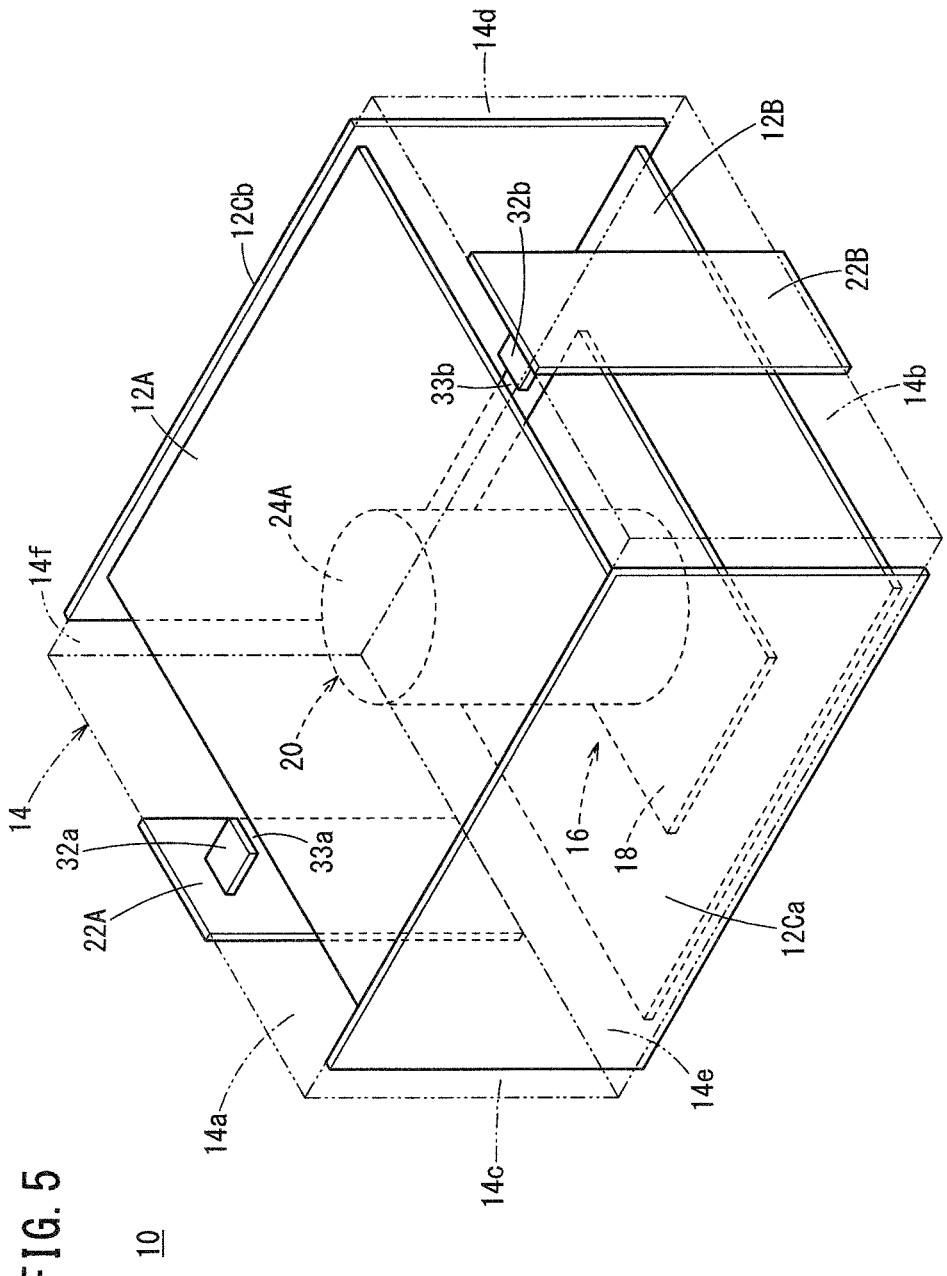
FIG. 5 is a perspective view showing a resonator according to a first modification of the first embodiment.

Next, a resonator according to a first modification of the present embodiment will be described with reference to FIG. 5.

In the resonator 10 according to the present modification, the via electrode portion 20 is formed by one via electrode 24A having a circular or elliptical cross section. As in the present modification, the via electrode portion 20 may be configured by one via electrode 24A having a circular or elliptical cross section.

Also in this modification, the first input/output terminal 22A is coupled to the upper shielding conductor 12A via the first gap 33a, and the second input/output terminal 22B is coupled to the upper shielding conductor 12A via the second gap 33b. Since the first input/output terminal 22A is coupled to the upper shielding conductor 12A via the first gap 33a, a capacitance is formed between the first input/output terminal 22A and the upper shielding conductor 12A, also in this modification. In addition, since the second input/output terminal 22B is coupled to the upper shielding conductor 12A via the second gap 33b, a capacitance is formed between the second input/output terminal 22B and the upper shielding conductor 12A, also in this modification. According to this modification, since the external Q can be adjusted by appropriately setting these capacitances, a resonator having good characteristics can be provided.

Modification 2

Figure 6:
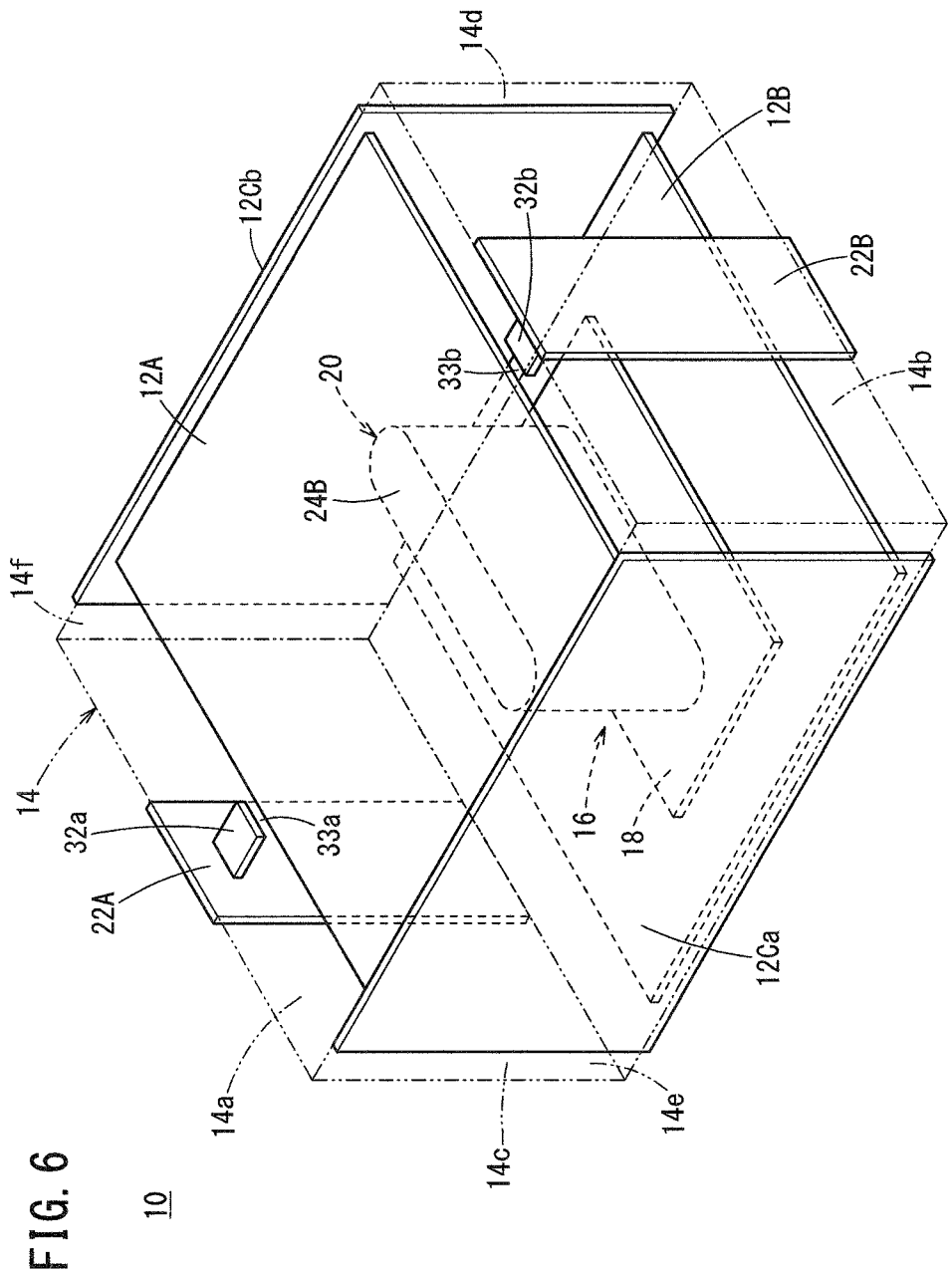
FIG. 6 is a perspective view showing a resonator according to a second modification of the first embodiment.

Next, a resonator according to a second modification of the present embodiment will be described with reference to FIG. 6.

In the resonator 10 according to this modification, the via electrode portion 20 is formed by one via electrode 24B having a track-shaped cross section. The track shape is a shape composed of two semicircular portions facing each other and two parallel linear portions connecting the semicircular portions. As in this modification, the via electrode portion 20 may be formed by one via electrode 24B having a track-shaped cross section.

Also in this modification, the first input/output terminal 22A is coupled to the upper shielding conductor 12A via the first gap 33a, and the second input/output terminal 22B is coupled to the upper shielding conductor 12A via the second gap 33b. Since the first input/output terminal 22A is coupled to the upper shielding conductor 12A via the first gap 33a, a capacitance is formed between the first input/output terminal 22A and the upper shielding conductor 12A, also in this modification. In addition, since the second input/output terminal 22B is coupled to the upper shielding conductor 12A via the second gap 33b, a capacitance is formed between the second input/output terminal 22B and the upper shielding conductor 12A, also in this modification. According to this modification, since the external Q can be adjusted by appropriately setting these capacitances, a resonator having good characteristics can be provided.

Modification 3

Figure 8A:
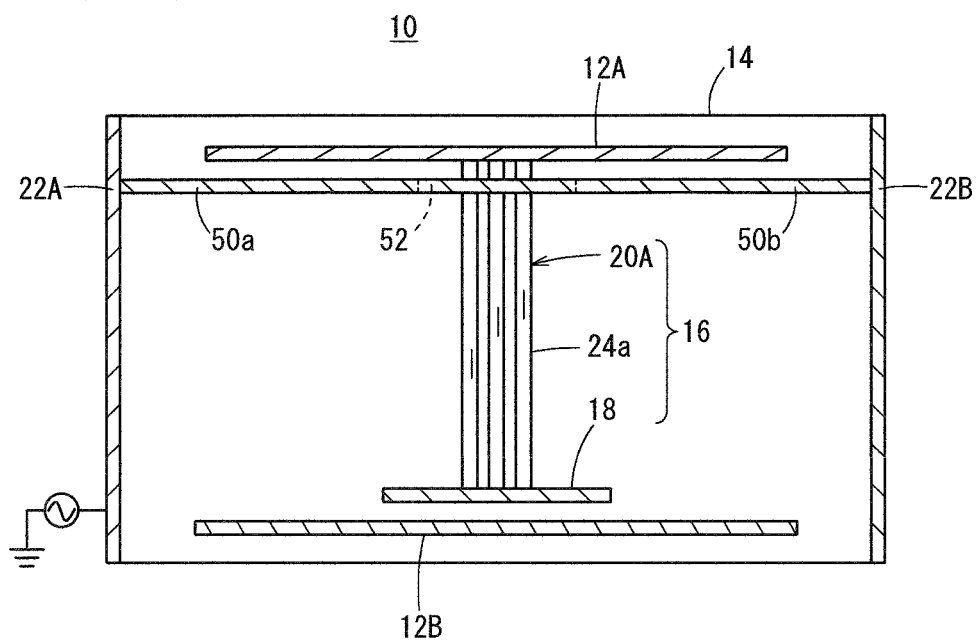
FIGS. 8A and 8B are cross-sectional views showing a resonator according to a third modification of the first embodiment.
Figure 8B:
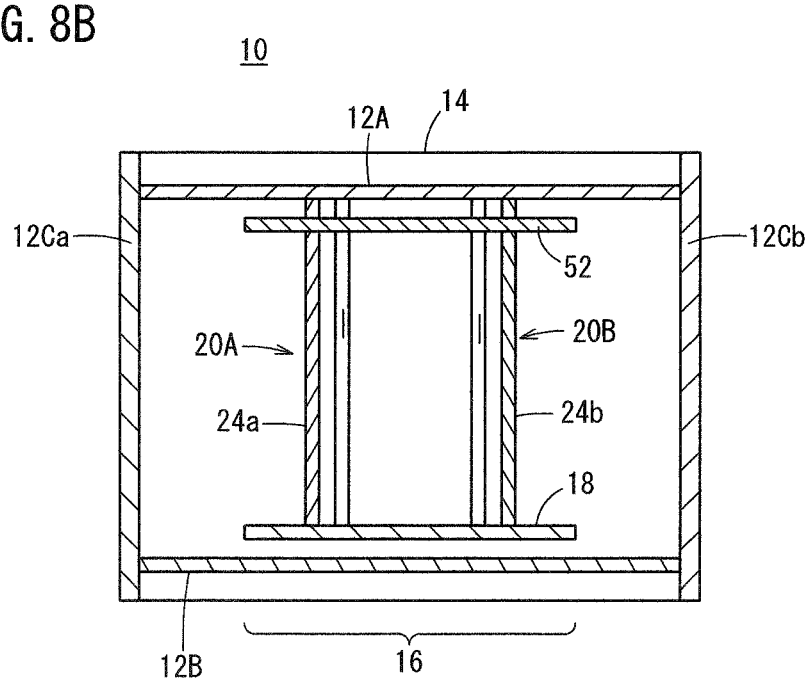

Next, a resonator according to a third modification of the present embodiment will be described with reference to FIGS. 7 to 8B. FIG. 7 is a perspective view showing a resonator according to this modification. FIGS. 8A and 8B are cross-sectional views showing a resonator according to this modification. FIG. 8A corresponds to a cross section taken along line VIIIA-VIIIA of FIG. 7A. FIG. 8B corresponds to a cross section taken along line VIIIB-VIIIB of FIG. 7.

In the resonator 10 according to this modification, the first input/output terminal 22A is electrically connected to the via electrode portion 20 via a connection line 50a. To be more specific, the first input/output terminal 22A is connected to an electrode 52 connected to the via electrode portion 20 via the connection line 50a. In this modification, the second input/output terminal 22B is electrically connected to the via electrode portion 20 via a connection line 50b. To be more specific, the second input/output terminal 22B is connected to an electrode 52 connected to the via electrode portion 20 via the connection line 50b.

Also in this modification, similarly to the resonator 10 described above with reference to FIGS. 1 to 4B, the via electrode portion 20, the first side surface shielding conductor 12Ca, and the second side surface shielding conductor 12Cb behave like a semi-coaxial resonator. The direction of the current flowing through the via electrode portion 20 is opposite to the direction of the current flowing through the first side surface shielding conductor 12Ca. Further, the direction of the current flowing through the via electrode portion 20 is opposite to the direction of the current flowing through the second side surface shielding conductor 12Cb. Therefore, an electromagnetic field can be confined in a portion surrounded by the shielding conductors 12A, 12B, 12Ca, and 12Cb, loss due to radiation can be reduced, and influence on the outside can be reduced. At a certain timing during resonance, a current flows so as to spread from the center of the upper shielding conductor 12A to the entire surface of the upper shielding conductor 12A. At this time, a current flows through the lower shielding conductor 12B so as to be concentrated from the entire surface of the lower shielding conductor 12B toward the center of the lower shielding conductor 12B. At another timing during resonance, a current flows so as to spread from the center of the lower shielding conductor 12B to the entire surface of the lower shielding conductor 12B. At this time, a current flows through the upper shielding conductor 12A so as to be concentrated from the entire surface of the upper shielding conductor 12A toward the center of the upper shielding conductor 12A. The current flowing so as to spread over the entire surface of the upper shielding conductor 12A or the lower shielding conductor 12B similarly flows through the first side surface shielding conductor 12Ca and the second side surface shielding conductor 12Cb. That is, a current flows through a conductor having a wide line width. Since a conductor having a wide line width has a small resistance component, deterioration of the Q value can be reduced, also in this modification.

In this manner, the first input/output terminal 22A and the second input/output terminal 22B may be electrically connected to the via electrode portion 20. According to this modification as well, it is possible to provide a resonator having good characteristics.

The positions of the connection lines 50a and 50b and the electrode 52 in the height direction, i.e., in the longitudinal direction of the via electrode portion 20, may be appropriately set. The external Q can be appropriately adjusted by appropriately setting the positions of the connection lines 50a and 50b and the electrode 52 in the height direction.

The connection lines 50a and 50b may be coupled to the strip line 18. In this case, the connection lines 50a and 50b may be connected to the strip line 18, or the connection lines 50a and 50b may be connected to the strip line 18 via a gap.

Modification 4

Figure 9:
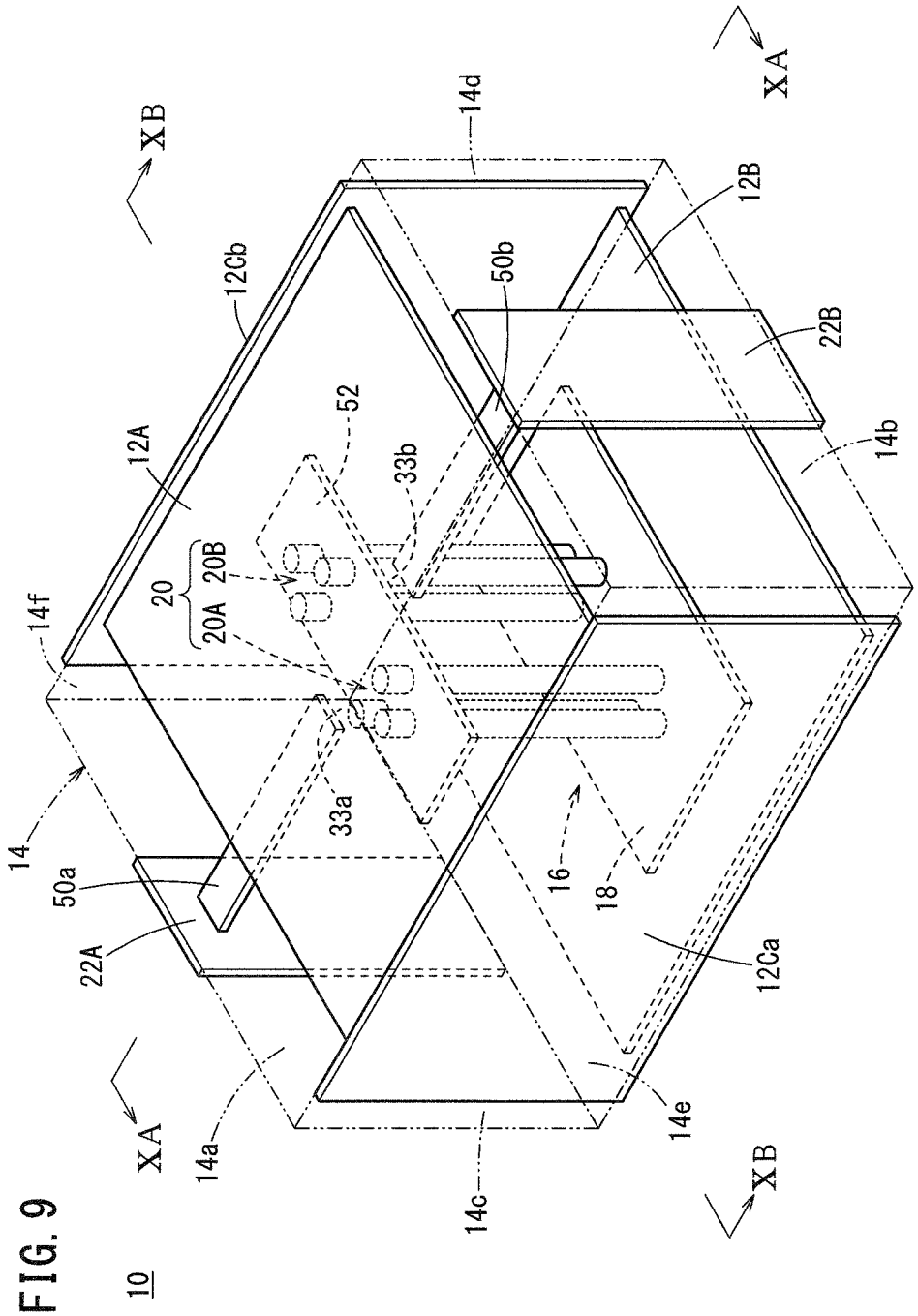
FIG. 9 is a perspective view showing a resonator according to a fourth modification of the first embodiment.
Figure 10A:
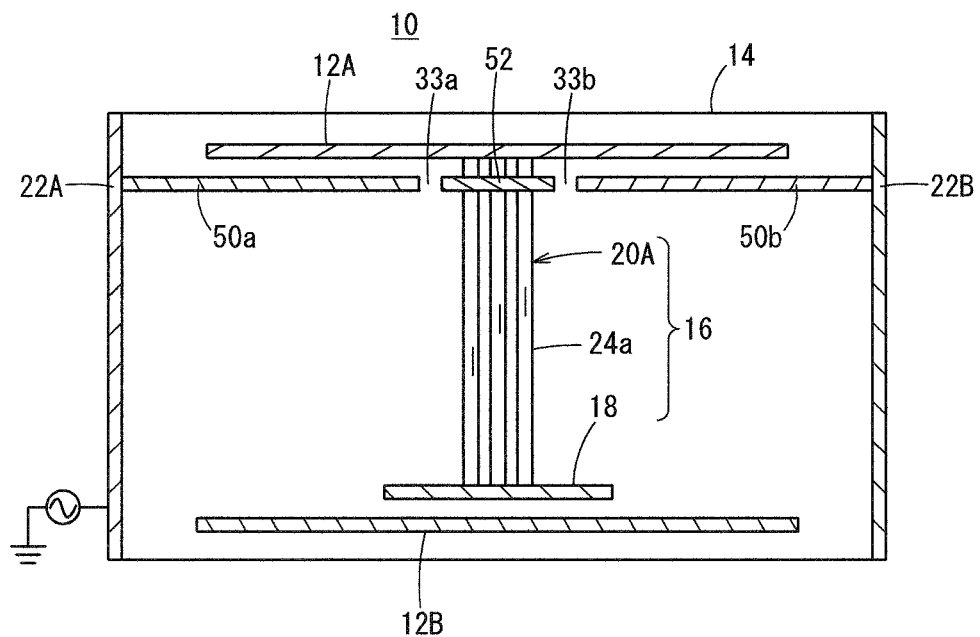
FIGS. 10A and 10B are cross-sectional views illustrating a resonator according to a fourth modification of the first embodiment.
Figure 10B:
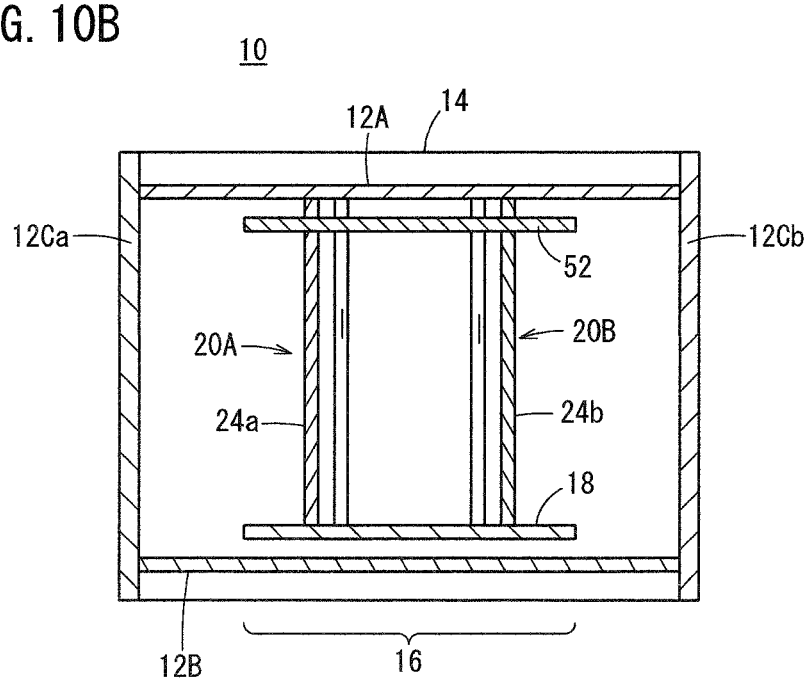

Next, a resonator according to a fourth modification of the present embodiment will be described with reference to FIGS. 9 to 10B. FIG. 9 is a perspective view showing a resonator according to this modification. FIGS. 10A and 10B are cross-sectional views showing a resonator according to this modification. FIG. 10A corresponds to a cross section taken along line XA-XA in FIG. 9. FIG. 10B corresponds to a cross section taken along line XB-XB in FIG. 9.

In the resonator 10 according to this modification, the connection line 50a connected to the first input/output terminal 22A is coupled to the electrode 52 connected to the via electrode portion 20 via the first gap 33a. In this modification, the connection line 50b connected to the second input/output terminal 22B is coupled to the electrode 52 connected to the via electrode portion 20 via the second gap 33b.

In this manner, the connection line 50a connected to the first input/output terminal 22A may be coupled to the electrode 52 connected to the via electrode portion 20 via the first gap 33a. The connection line 50b connected to the second input/output terminal 22B may be coupled to the electrode 52 connected to the via electrode portion 20 via the second gap 33b. In this modification, a capacitance is formed between the connection line 50a connected to the first input/output terminal 22A and the electrode 52. In the present modification, a capacitance is formed between the connection line 50b connected to the second input/output terminal 22B and the electrode 52. According to this modification, since the external Q can be adjusted by appropriately setting these capacitances, a resonator having good characteristics can be provided.

Second Embodiment

Figure 11:
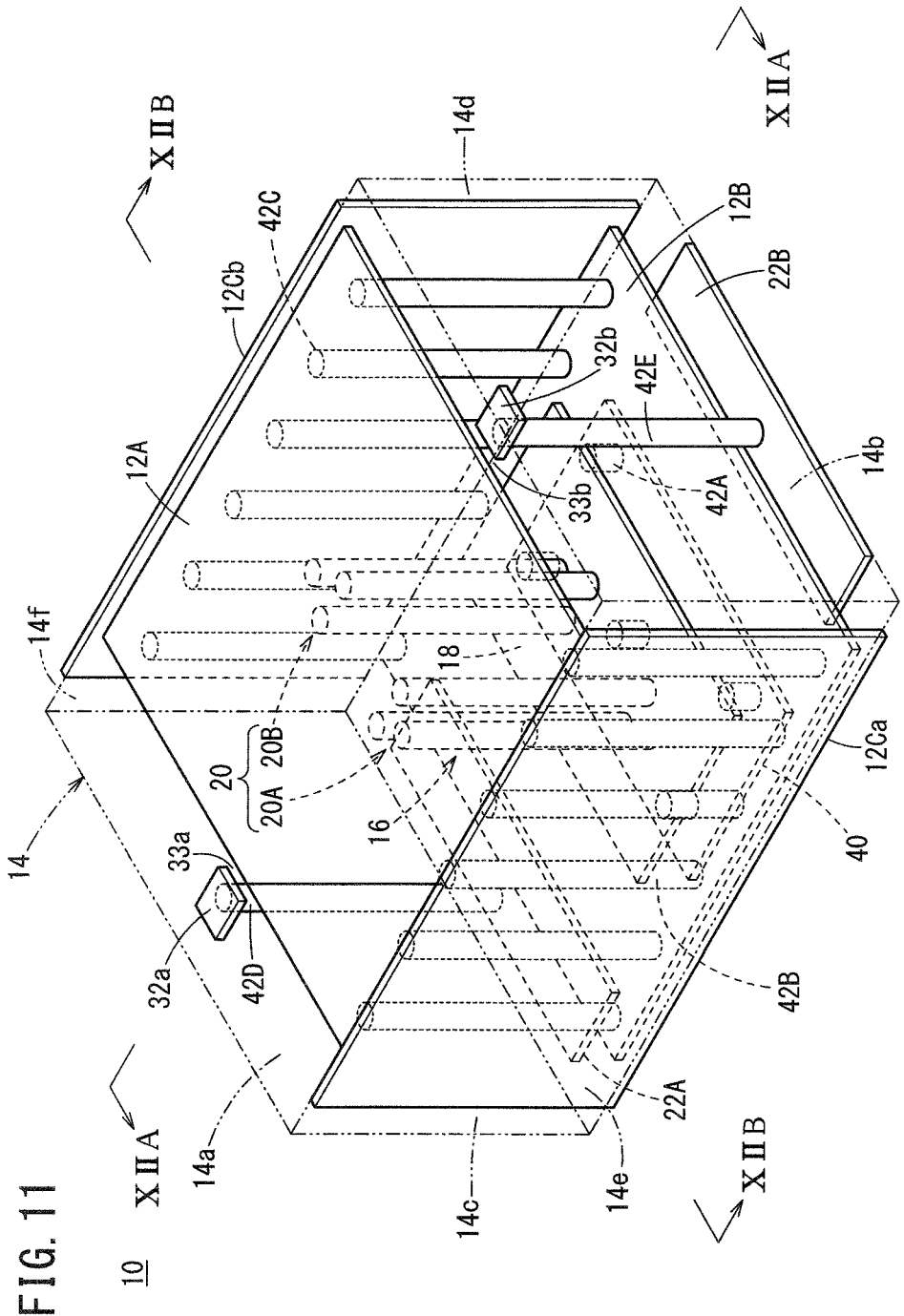
FIG. 11 is a perspective view showing a resonator according to a second embodiment.
Figure 12A:
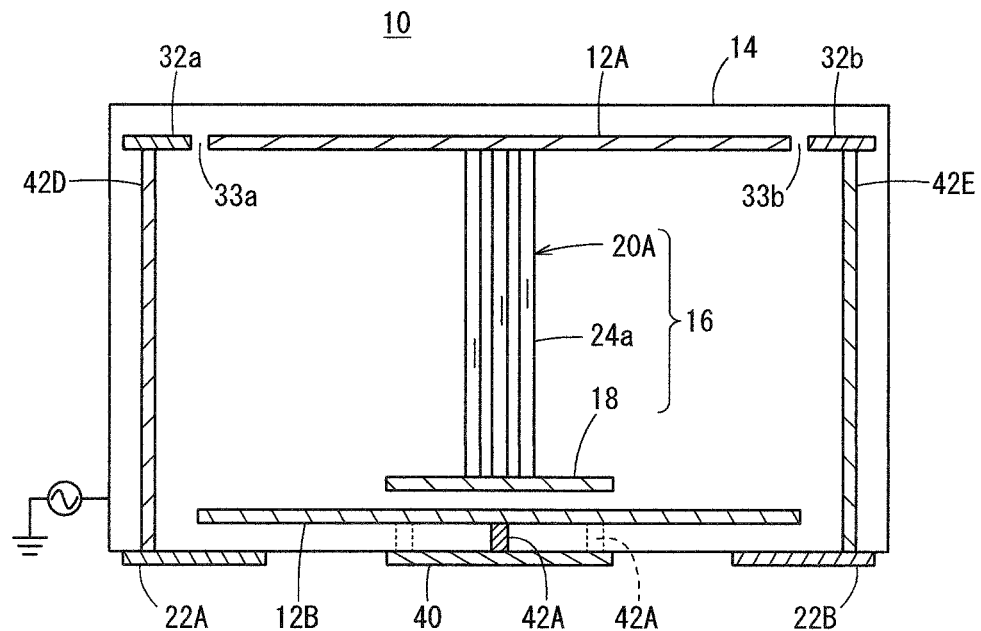
FIGS. 12A and 12B are cross-sectional views showing the resonator according to the second embodiment.
Figure 12B:
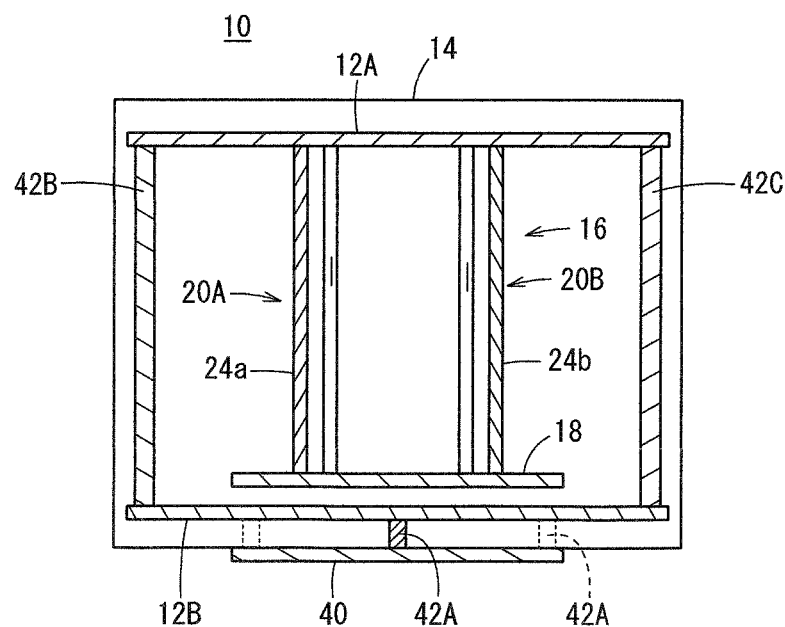

The resonator according to the second embodiment will be described with reference to FIGS. 11 to 12B. The same components as those of the resonator according to the first embodiment are denoted by the same reference numerals, and the description thereof will be omitted or simplified. FIG. 11 is a perspective view showing the resonator according to the present embodiment. FIGS. 12A and 12B are cross-sectional views showing the resonator according to the present embodiment. FIG. 12A corresponds to a cross section taken along line XIIA-XIIA of FIG. 11. FIG. 12B corresponds to a cross section taken along line XIIB-XIIB of FIG. 11.

In the resonator 10 according to the present embodiment, the first input/output terminal 22A and the second input/output terminal 22B are not formed on the side surfaces 14a and 14b of the dielectric substrate 14. In the present embodiment, the first input/output terminal 22A is formed at a position facing the connection line 32a of the upper shielding conductor 12A on the lower surface 14e of the dielectric substrate 14. In the present embodiment, the connection line 32a and the first input/output terminal 22A are electrically connected to each other via a fourth via hole 42D. Further, in the present embodiment, the second input/output terminal 22B is formed at a position facing the connection line 32b of the upper shielding conductor 12A on the lower surface 14e of the dielectric substrate 14. In the present embodiment, the connection line 32b and the second input/output terminal 22B are electrically connected to each other via a fifth via hole 42E.

In the resonator 10 according to the present embodiment, an external terminal 40 to which a constant potential (for example, a ground potential) is supplied is formed on the lower surface 14e of the dielectric substrate 14. In the present embodiment, the lower shielding conductor 12B is formed inside the dielectric substrate 14. In the present embodiment, the lower shielding conductor 12B and the external terminal 40 are electrically connected to each other via a first via hole 42A. In addition, in the present embodiment, a plurality of (for example, six) second via holes 42B that electrically connect the upper shielding conductor 12A and the lower shielding conductor 12B are formed along the side surface 14c in a portion close to the side surface 14c in the dielectric substrate 14. That is, a plurality of second via holes 42B functioning as the first side surface shielding conductor 12Ca are formed. In addition, in the present embodiment, a plurality of (for example, six) third via holes 42C that electrically connect the upper shielding conductor 12A and the lower shielding conductor 12B are formed along the side surface 14d in a portion close to the side surface 14d in the dielectric substrate 14. That is, a plurality of third via holes 42C functioning as the second side surface shielding conductor 12Cb are formed.

The first side surface shielding conductor 12Ca and the second side surface shielding conductor 12Cb may not be formed.

In the resonator 10 according to the present embodiment, for example, when a current in the positive direction is supplied to the first input/output terminal 22A formed on the lower surface 14e of the dielectric substrate 14, the following occurs. That is, the current in the positive direction flows through the fourth via hole 42D, spreads over the upper shielding conductor 12A, and then flows toward the second via hole 42B and the third via hole 42C. At this time, a displacement current also flows from the strip line 18 toward the upper shielding conductor 12A via the via electrode portion 20, and this displacement current also flows toward the second via hole 42B and the third via hole 42C via the upper shielding conductor 12A. That is, from the moment when, for example, a current in the positive direction is supplied to the first input/output terminal 22A, the current (the current in the positive direction and the displacement current) flows while spreading from the upper shielding conductor 12A to the second via hole 42B and the third via hole 42C. Therefore, even if neither the first side surface shielding conductor 12Ca nor the second side surface shielding conductor 12Cb is provided, the second via hole 42B and the third via hole 42C can serve as the first side surface shielding conductor 12Ca and the second side surface shielding conductor 12Cb.

According to the present embodiment, the resonator 10 can be mounted by performing flip-chip mounting on the external terminal 40, the first input/output terminal 22A, and the second input/output terminal 22B formed on the lower surface 14e of the dielectric substrate 14. Therefore, according to the present embodiment, high-density mounting can be realized. According to this embodiment as well, a resonator having good characteristics can be provided.

Third Embodiment

Figure 13:
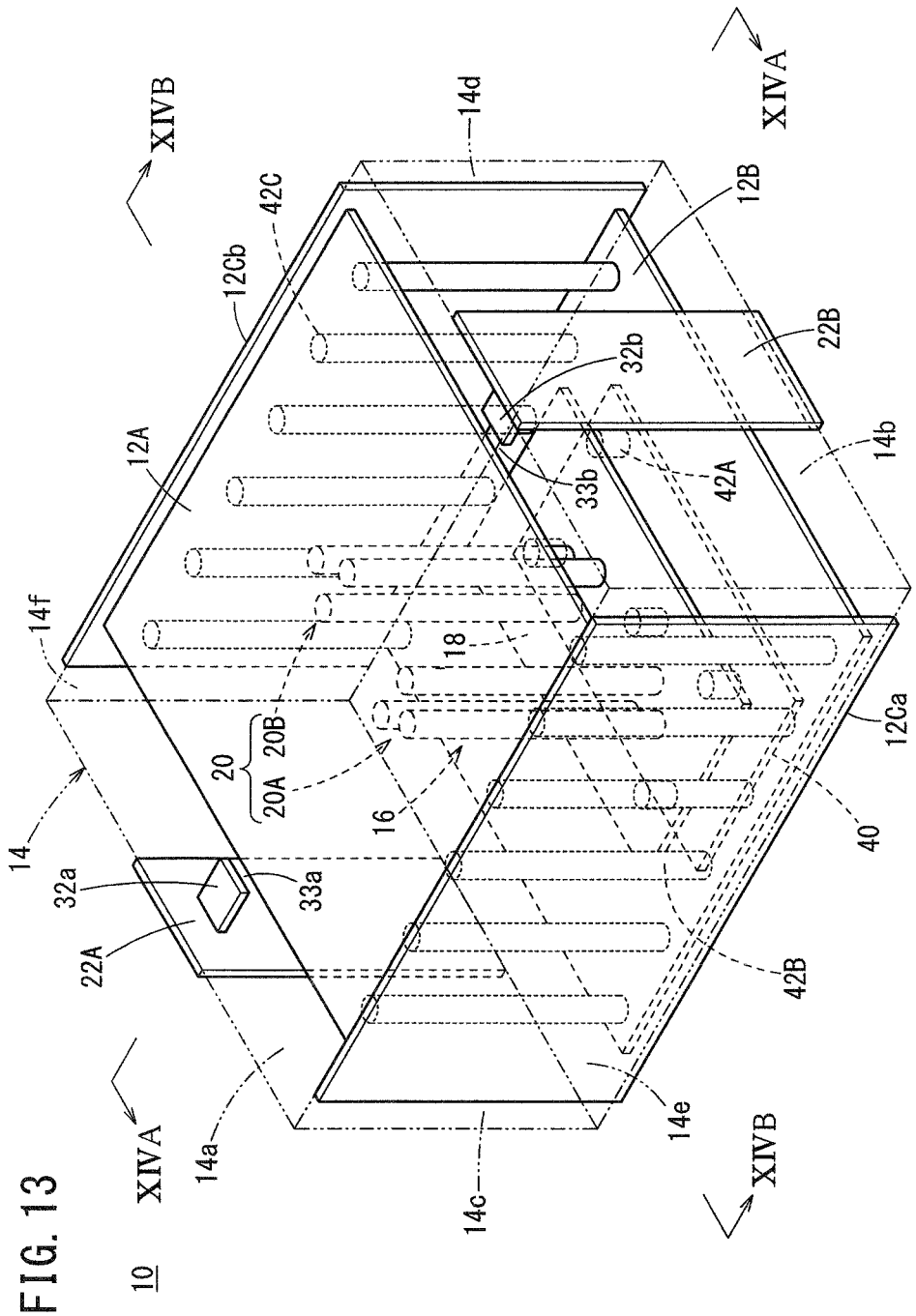
FIG. 13 is a perspective view showing a resonator according to a third embodiment.
Figure 14A:
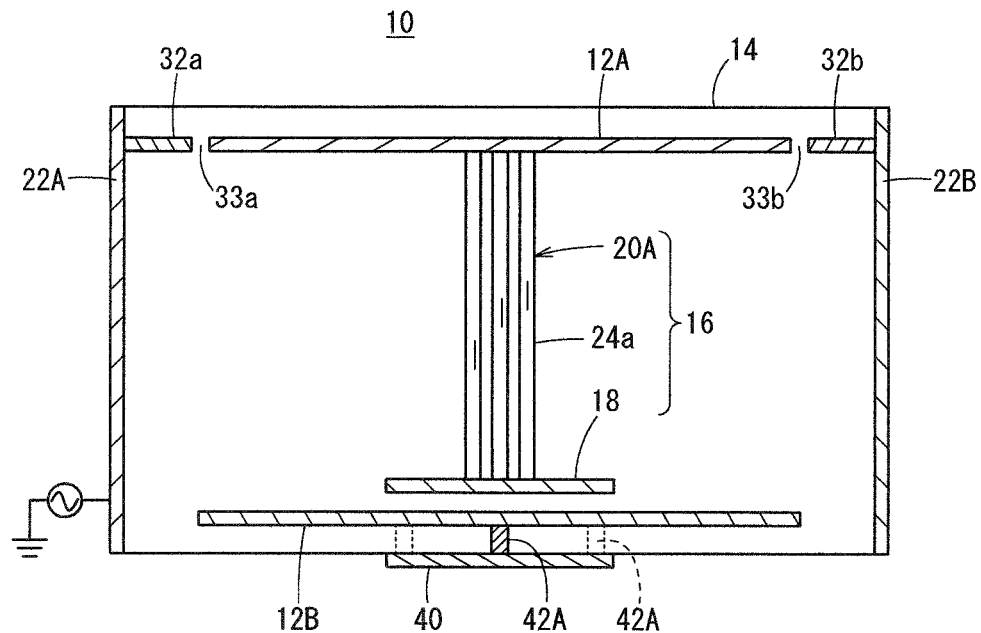
FIGS. 14A and 14B are cross-sectional views showing a resonator according to the third embodiment.
Figure 14B:
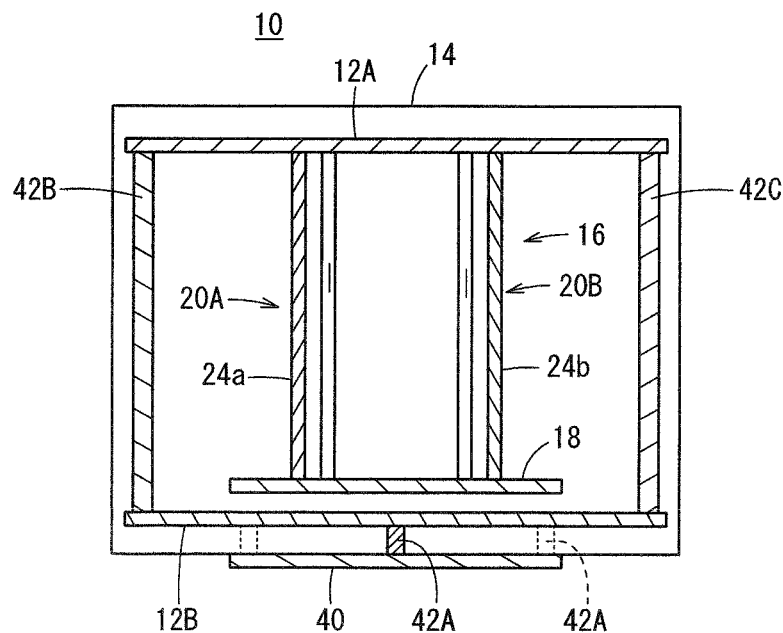

The resonator according to the third embodiment will be described with reference to FIGS. 13 to 14B. FIG. 13 is a perspective view showing the resonator according to the present embodiment. FIGS. 14A and 14B are cross-sectional views showing the resonator according to the present embodiment. FIG. 14A corresponds to a cross section taken along line XIVA-XIVA of FIG. 13. FIG. 14B corresponds to a cross section taken along line XIVB-XIVB of FIG. 13. The same components as those of the resonator according to the first or second embodiment are denoted by the same reference numerals, and the description thereof will be omitted or simplified.

In the resonator 10 according to the present embodiment, the first input/output terminal 22A and the second input/output terminal 22B are formed on the side surfaces 14a and 14b of the dielectric substrate 14. Note that the first side surface shielding conductor 12Ca and the second side surface shielding conductor 12Cb may not be provided.

In the present embodiment, for example, when a current in the positive direction is supplied to the first input/output terminal 22A, the current in the positive direction flows to spread over the upper shielding conductor 12A and flows toward the second via hole 42B and the third via hole 42C. At this time, a displacement current also flows from the strip line 18 toward the upper shielding conductor 12A via the via electrode portion 20, and this displacement current also flows toward the second via hole 42B and the third via hole 42C via the upper shielding conductor 12A. That is, from the moment when, for example, a current in the positive direction is supplied to the first input/output terminal 22A, the current (the current in the positive direction and the displacement current) flows while spreading from the upper shielding conductor 12A to the second via hole 42B and the third via hole 42C. Therefore, even if neither the first side surface shielding conductor 12Ca nor the second side surface shielding conductor 12Cb is provided, the second via hole 42B and the third via hole 42C can serve as the first side surface shielding conductor 12Ca and the second side surface shielding conductor 12Cb.

In this manner, the first input/output terminal 22A and the second input/output terminal 22B may be formed on the side surfaces 14a and 14b of the dielectric substrate 14. According to the present embodiment, the resonator 10 can be mounted by performing side surface mounting on the first input/output terminal 22A and the second input/output terminal 22B and flip-chip mounting on the external terminal 40 formed on the lower surface 14e of the dielectric substrate 14. Therefore, high-density mounting can also be realized by this embodiment. According to this embodiment as well, a resonator having good characteristics can be provided.

Fourth Embodiment

Figure 15:
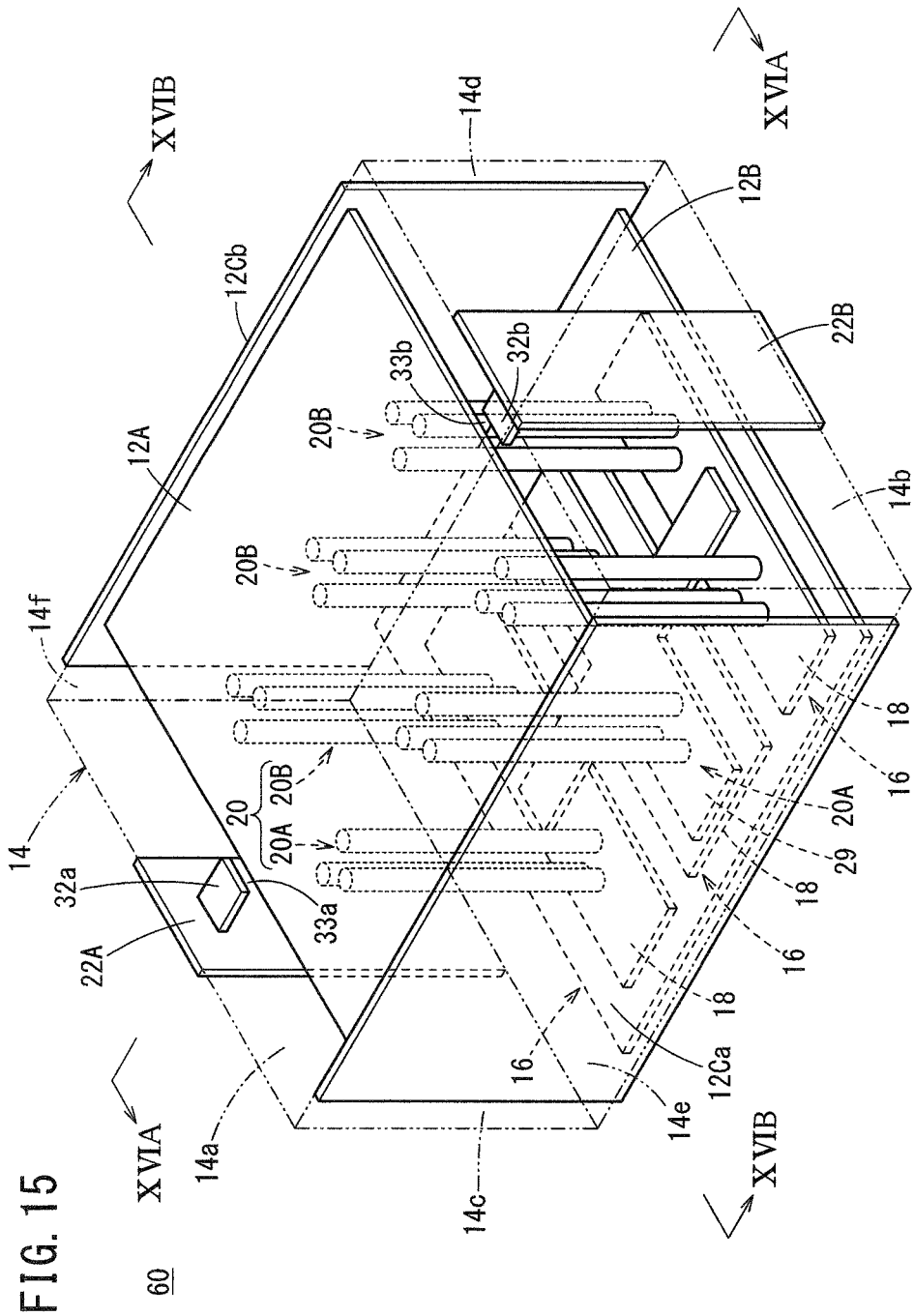
FIG. 15 is a perspective view showing a filter according to a fourth embodiment.
Figure 16A:
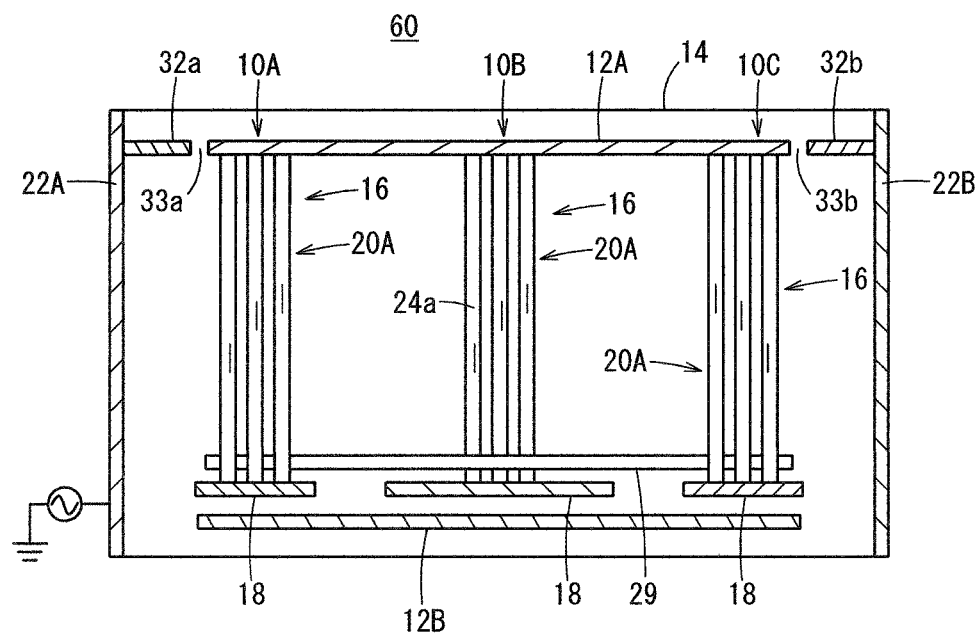
FIGS. 16A and 16B are cross-sectional views showing a filter according to the fourth embodiment.
Figure 16B:
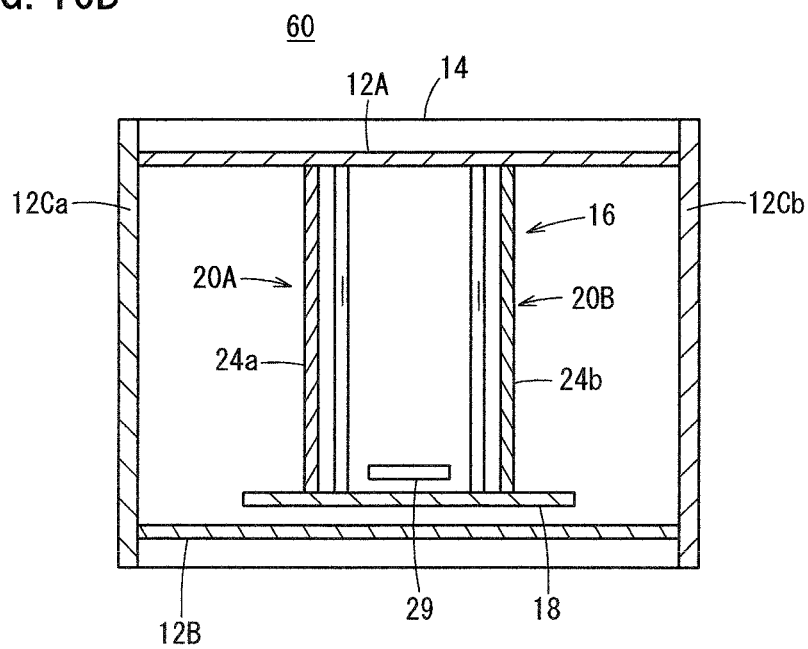
Figure 17:
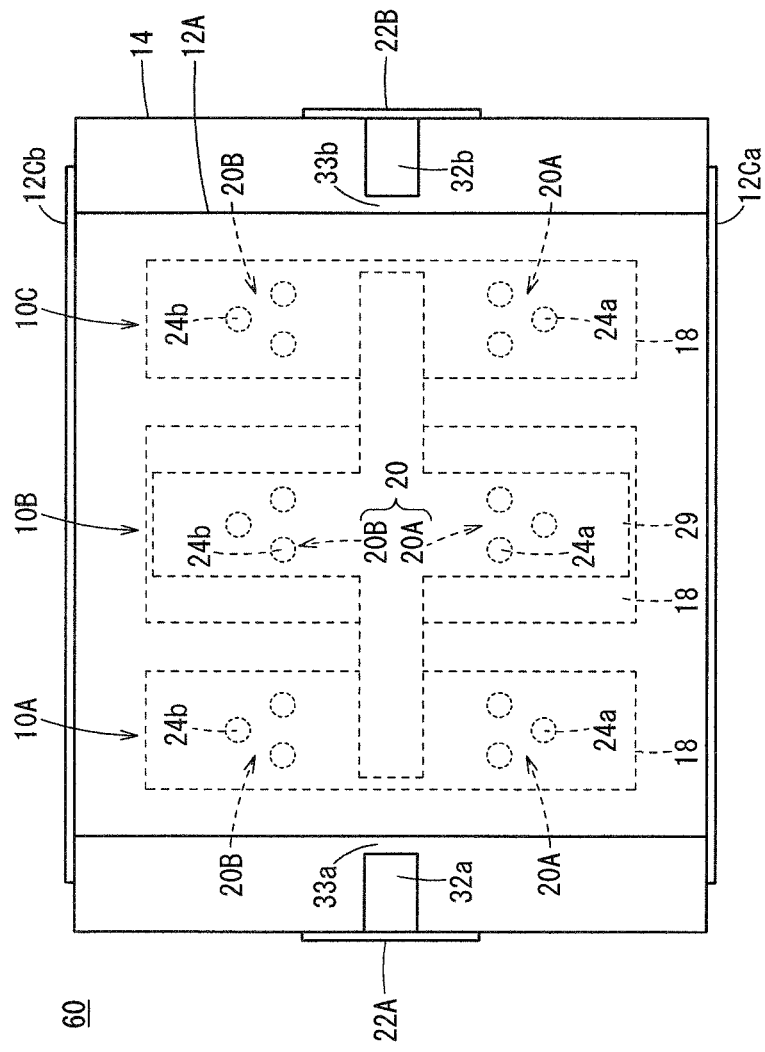
FIG. 17 is a plan view showing a filter according to the fourth embodiment.

The filter according to the fourth embodiment will be described with reference to FIGS. 15 to 19. FIG. 15 is a perspective view showing the filter according to the present embodiment. FIGS. 16A and 16B are cross-sectional views showing the filter according to the present embodiment. FIG. 16A corresponds to a cross section taken along line XVIA-XVIA of FIG. 15. FIG. 16B corresponds to a cross section taken along line XVIB-XVIB of FIG. 15. FIG. 17 is a plan view showing the filter according to the present embodiment. The same components as those of the resonators according to the first to third embodiments are denoted by the same reference numerals, and the description thereof will be omitted or simplified.

The filter (dielectric filter) 60 according to the present embodiment includes a plurality of resonators 10, for example, resonators 10A to 10C (see FIG. 16A). As the resonators 10A to 10C, for example, the resonators 10 described above with reference to FIGS. 1 to 4B are used. Here, a case where three resonators 10A to 10C are provided will be described as an example, but the present invention is not limited thereto. That is, although the case where the resonators 10 are arranged in three stages will be described as an example, the present invention is not limited thereto.

Each of the resonators 10A to 10C is provided with a structure 16. As described above, the structure 16 includes the strip line 18 facing the lower shielding conductor 12B and the via electrode portion 20 formed inside the dielectric substrate 14 and extending from the upper shielding conductor 12A to the strip line 18. The size of each component of each structure 16 is appropriately set so as to obtain desired electrical characteristics.

A coupling capacitance electrode (coupling pattern) 29 is further disposed inside the dielectric substrate 14. A part of the coupling capacitance electrode 29 faces the strip line 18 on the resonator 10B. The coupling capacitance electrode 29 is connected to the via electrode portion 20 on the resonator 10B. The coupling capacitance electrode 29 is connected to the upper shielding conductor 12A by a portion other than a lower portion of the via electrode portion 20 on the resonator 10B. The coupling capacitance electrode 29 is connected to the strip line 18 on the resonator 10B by the lower portion of the via electrode portion 20 on the resonator 10B. The coupling capacitance electrode 29 extends from a position above the strip line 18 of the resonator 10B to a position above the strip line 18 between the first via electrode portion 20A of the resonator 10A and the second via electrode portion 20B of the resonator 10A. The coupling capacitance electrode 29 extends from a position above the strip line 18 of the resonator 10B to a position above the strip line 18 between the first via electrode portion 20A of the resonator 10C and the second via electrode portion 20B of the resonator 10C.

In this manner, the filter 60 may be configured by appropriately using the plurality of resonators 10, i.e., resonators 10A to 10C. Since the resonator 10 having good characteristics is used, the filter 60 having good characteristics can be obtained. Moreover, since the input/output terminals 22A and 22B are connected to the upper shielding conductor 12A via the gaps 33a and 33b, the external Q can be adjusted. Therefore, according to the present embodiment, the filter 60 having good characteristics can be provided.

Figure 18:
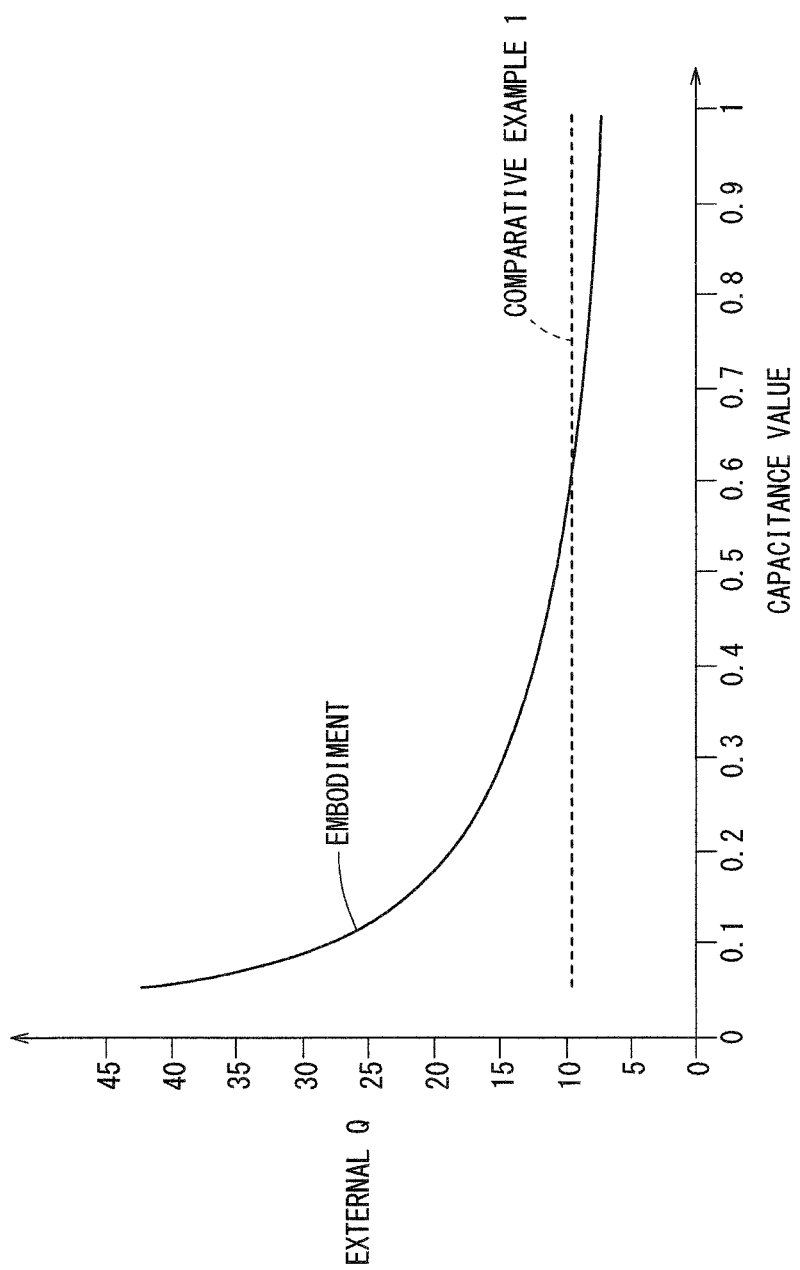
FIG. 18 is a graph showing a simulation result of the external Q.

An evaluation result of the external Q of the filter according to the present embodiment will be described with reference to FIG. 18. FIG. 18 is a graph showing a simulation result of the external Q. The horizontal axis of FIG. 18 indicates the capacitance, i.e., capacitance value, between the first input/output terminal 22A and the upper shielding conductor 12A. The vertical axis of FIG. 18 indicates the external Q. The solid line in FIG. 18 indicates the external Q in the case of the embodiment, that is, in the filter 60 according to the present embodiment. A dotted line in FIG. 18 indicates the external Q in the case of Comparative Example 1, that is, in the case where the first input/output terminal 22A and the upper shielding conductor 12A are electrically connected to each other.

As can be seen from FIG. 18, in the case of Comparative Example 1, that is, in the case where the first input/output terminal 22A and the upper shielding conductor 12A are electrically connected to each other, the external Q is, for example, 9.9.

On the other hand, in the case of the embodiment, that is, in the filter 60 according to the present embodiment, when the capacitance between the first input/output terminal 22A and the upper shielding conductor 12A is changed, the external Q is changed. That is, in the present embodiment, the external Q can be adjusted by changing the capacitance between the first input/output terminal 22A and the upper shielding conductor 12A. Moreover, in the embodiment example, that is, in the present embodiment, the external Q can be made smaller than in the case of Comparative Example 1. In the present embodiment, it is considered that the external Q can be made smaller than that in the case of Comparative Example 1 because the first input/output terminal 22A and the via electrode portion 20 extend in the same direction and sufficient magnetic field interference occurs therebetween.

Figure 19:
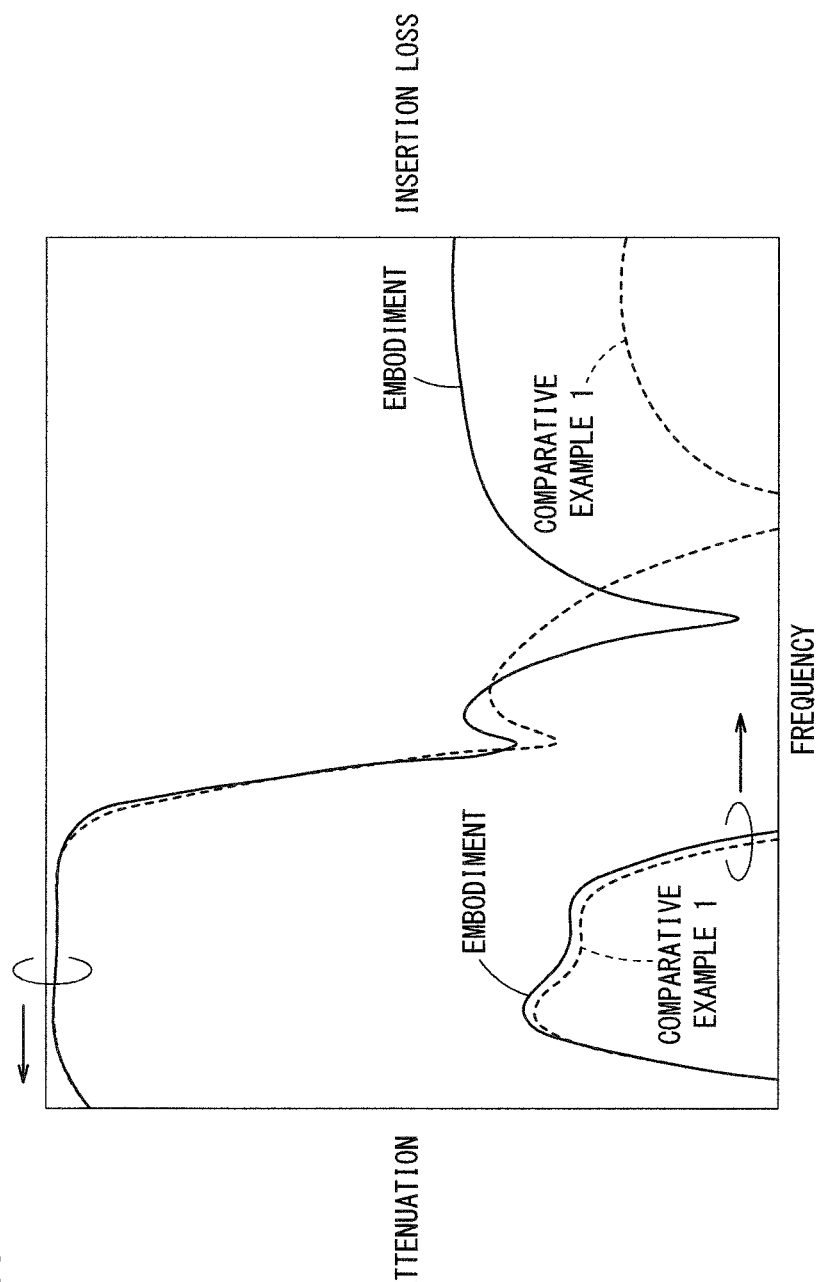
FIG. 19 is a graph showing simulation results of attenuation and insertion loss.

Evaluation results of characteristics of the filter according to the present embodiment will be described with reference to FIG. 19. FIG. 19 is a graph showing simulation results of attenuation and insertion loss. The vertical axis on the left side of FIG. 19 indicates the attenuation amount. The vertical axis on the right side of FIG. 19 indicates the insertion loss. The horizontal axis of FIG. 19 represents frequency. The solid line in FIG. 19 shows the case of the embodiment example, that is, the present embodiment. The broken line in FIG. 19 shows Comparative Example 1, that is, the case where the first input/output terminal 22A and the upper shielding conductor 12A are electrically connected to each other.

As can be seen from FIG. 19, according to the present embodiment, a filter having good characteristics can be obtained.

The superiority of the filter according to the present embodiment over the filter (not shown) according to Comparative Example 2 will be described.

In the filter according to Comparative Example 2, the connection line 32a connected to the first input/output terminal 22A is directly connected to the first via electrode portion 20A and the second via electrode portion 20B of the resonator 10A. In the filter according to Comparative Example 2, the connection line 32b connected to the second input/output terminal 22B is directly connected to the first via electrode portion 20A and the second via electrode portion 20B of the resonator 10C. In the filter according to Comparative Example 2, the external Q can be adjusted by changing the positions of the connection lines 32a and 32b in the height direction, i.e., in the longitudinal direction of the via electrode portion 20. However, in the filter according to Comparative Example 2, the positions of the connection lines 32a and 32b in the height direction can be changed only in units of thickness of the plurality of dielectric layers constituting the dielectric substrate 14. In the filter according to Comparative Example 2, in order to obtain a plurality of types of filters having different external Qs, it is necessary to change the stacked structure of the dielectric layers constituting the dielectric substrate 14. In addition, in the filter according to Comparative Example 2, the current concentrates on the connection lines 32a and 32b, the insertion loss tends to increase.

On the other hand, in the present embodiment, the capacitance between the first input/output terminal 22A and the upper shielding conductor 12A can be adjusted only by changing the dimension of the first gap 33a. In the present embodiment, the capacitance between the second input/ output terminal 22B and the upper shielding conductor 12A can be adjusted only by changing the dimension of the second gap 33b. The size of the first gap 33a and the size of the second gap 33b can be finely adjusted. Therefore, according to the present embodiment, it is possible to easily obtain a filter having desired characteristics. Further, in the present embodiment, since the current is not concentrated on the connection lines 32a and 32b, it is possible to obtain an excellent filter having a small insertion loss.

Here, an example in which the resonators 10 described above with reference to FIGS. 1 to 4B are arranged in multiple stages has been described, but the present invention is not limited thereto. The resonator 10 described above with reference to FIG. 5, the resonator 10 described above with reference to FIG. 6, the resonator 10 described above with reference to FIGS. 7 to 8B, or the resonator 10 described above with reference to FIGS. 9 to 10B may be provided in multiple stages. The resonator 10 described above with reference to FIGS. 11 to 12B and the resonator 10 described above with reference to FIGS. 13 to 14B may be provided in multiple stages.

While the present invention has been described with reference to the preferred embodiments, the present invention is not limited to the above-described embodiments, and various modifications can be made without departing from the scope of the present invention.

The above embodiments are summarized as follows.

The resonator (10) includes a via electrode portion (20) formed inside a dielectric substrate (14), a plurality of shielding conductors (12A, 12B, 12Ca, and 12Cb) formed on the dielectric substrate so as to surround the via electrode portion, and a strip line (18) connected to the via electrode portion inside the dielectric substrate and facing at least the shielding conductor. A first input/output terminal (22A) and a second input/output terminal (22B) are capacitively coupled via gaps (33a, 33b) to a shielding conductor (12A), among the plurality of shielding conductors, to which the short-circuited end of the via electrode portion is connected. According to such a configuration, the first input/output terminal is coupled to the shielding conductor via the gap, and the second input/output terminal is coupled to the shielding conductor via the gap. Since the first input/output terminal is coupled to the shielding conductor via the gap, a capacitance is formed between the first input/output terminal and the shielding conductor. Further, since the second input/output terminal is coupled to the shielding conductor via the gap, a capacitance is formed between the second input/output terminal and the shielding conductor. Therefore, according to such a configuration, the external Q can be adjusted by appropriately setting these capacitances. Therefore, according to such a configuration, a resonator having good characteristics can be provided.

The plurality of shielding conductors may include a first shielding conductor (12A) formed on a first principal surface (14f) side of the dielectric substrate, a second shielding conductor (12B) formed on a second principal surface (14e) side of the dielectric substrate, a third shielding conductor (12Ca) formed on a first side surface (14c) side of the dielectric substrate, and a fourth shielding conductor (12Cb) formed on a second side surface (14d) side of the dielectric substrate, the short-circuited end of the via electrode portion may be connected to the first shielding conductor, and the first input/output terminal and the second input/output terminal may be capacitively coupled to the first shielding conductor via gaps.

The resonator (10) includes a via electrode portion (20) formed inside a dielectric substrate, a plurality of shielding conductors (12A, 12B, 12Ca, 12Cb) formed on the dielectric substrate so as to surround the via electrode portion, and a strip line (18) connected to the via electrode portion inside the dielectric substrate and facing at least the shielding conductor, and a first input/output terminal (22A) or a second input/output terminal (22B) is coupled to the via electrode portion. With such a configuration, it is also possible to provide a resonator having good characteristics.

The first input/output terminal or the second input/output terminal may be electrically connected to the via electrode portion.

The first input/output terminal or the second input/output terminal may be capacitively coupled to the via electrode portion via a gap.

The via electrode portion may include a first via electrode portion (20A) and a second via electrode portion (20B) formed adjacent to each other, the first via electrode portion may include a plurality of first via electrodes (24a), the second via electrode portion may include a plurality of second via electrodes (24b), and there may be no other via electrode portions between the first via electrode portion and the second via electrode portion. According to such a configuration, since there are no other via electrode portions between the first via electrode portion and the second via electrode portion, it is possible to shorten the time required for forming the vias, and it is possible to realize an improvement in throughput. In addition, according to such a configuration, since there is no other via electrode portion between the first via electrode portion and the second via electrode portion, it is possible to reduce the amount of a material such as silver embedded in the vias, and thus it is possible to realize cost reduction. In addition, since a region in which an electromagnetic field is relatively sparse is formed between the first via electrode portion and the second via electrode portion, a coupling adjustment electrode or the like can be formed in the region.

The plurality of first via electrodes may be arranged along a virtual first curved line (45a) when viewed from the upper surface, and the plurality of second via electrodes may be arranged along a virtual second curved line (45b) when viewed from the upper surface.

The first curved line and the second curved line may each constitute a part of one virtual ellipse (37) or a part of one virtual track shape (38).

The first via electrode portion may constitute a first λ/4 resonator (34A) together with the strip line, and the second via electrode portion may constitute a second λ/4 resonator (34B) together with the strip line.

The filter (60) includes a resonator as described above.

REFERENCE SIGNS LIST 10, 10A to 100: resonator
12A: upper shielding conductor
12B: lower shielding conductor
12Ca: first side surface shielding conductor
12Cb: second side surface shielding conductor
14: dielectric substrate
14a to 14d: side surface
14e, 14f: principal surface
16: structure
18: strip line
20: via electrode portion
20A: first via electrode portion
20B: second via electrode portion
22A: first input/output terminal
22B: second input/output terminal 24a: first via electrode
24b: second via electrode
24A, 24B: via electrode
29: coupling capacitance electrode
32a, 32b: connection line
33a: first gap
33b: second gap
34A: first λ/4 resonator
34B: second λ/4 resonator
37: ellipse
38: track shape
40: external terminal
42A to 42E: first via hole to fifth via hole
45a: first curved line
45b: second curved line
50a, 50b: connection line
52: electrode

The invention claimed is:

1. A resonator comprising:
   a via electrode portion formed inside a dielectric substrate;
   a plurality of shielding conductors formed on the dielectric substrate so as to surround the via electrode portion; and
   a strip line connected to the via electrode portion inside the dielectric substrate and that faces at least the shielding conductor,
   wherein a first input/output terminal or a second input/output terminal is coupled to the via electrode portion without involving the shielding conductors and the strip line.

2. The resonator according to claim 1, wherein the first input/output terminal or the second input/output terminal is electrically connected to the via electrode portion.

3. The resonator according to claim 2, wherein the via electrode is coupled to the first input/output terminal or the second input/output terminal through an electrode and a connection line, the electrode being connected to a portion of the via electrode between one end and another end of the via electrode, the connection line being formed inside the dielectric substrate.

4. The resonator according to claim 1, wherein the first input/output terminal or the second input/output terminal is capacitively coupled to the via electrode portion via a gap.

5. The resonator according to claim 4, wherein the via electrode is capacitively coupled to the first input/output terminal or the second input/output terminal through an electrode, the gap and a connection line, the electrode being connected to a portion of the via electrode between one end and another end of the via electrode, the connection line being formed inside the dielectric substrate.

6. The resonator according to claim 1, wherein:
   the via electrode portion includes a first via electrode portion and a second via electrode portion that are formed adjacent to each other;
   the first via electrode portion includes a plurality of first via electrodes;
   the second via electrode portion includes a plurality of second via electrodes; and
   there are no other via electrode portions between the first via electrode portion and the second via electrode portion.

7. The resonator according to claim 6, wherein:
   the plurality of first via electrodes are arranged along a virtual first curved line when viewed from an upper surface; and
   the plurality of second via electrodes are arranged along a virtual second curved line when viewed from the upper surface.

8. The resonator according to claim 7, wherein each of the first curved line and the second curved line constitutes a part of one virtual ellipse or a part of one virtual track shape.

9. The resonator according to claim 6, wherein:
   the first via electrode portion constitutes a first λ/4 resonator together with the strip line; and
   the second via electrode portion constitutes a second Δ/4 resonator together with the strip line.

10. A filter comprising a plurality of resonators each comprising:
    a via electrode portion formed inside a dielectric substrate;
    a plurality of shielding conductors formed to surround the via electrode portion; and
    a strip line connected to one end of the via electrode portion and that faces at least one of the plurality of shielding conductors, wherein
    a first input/output terminal is coupled, without involving the shielding conductors and the strip line, to the via electrode portion of a first resonator of the plurality of the resonators, and
    a second input/output terminal is coupled, without involving the shielding conductors and the strip line, to the via electrode portion of a second resonator of the plurality of the resonators.

* * * * *